United States Patent [19]
Koyanagi et al.

[11] Patent Number: 6,012,014
[45] Date of Patent: Jan. 4, 2000

[54] MAP DISPLAY APPARATUS FOR MOTOR VEHICLE

[75] Inventors: Takuo Koyanagi, Zama; Koichi Yaita, Tokyo; Takashi Mori, Fujisawa, all of Japan

[73] Assignee: Xanavi Informatics Corporation, Kanagawa, Japan

[21] Appl. No.: 09/120,805

[22] Filed: Jul. 23, 1998

Related U.S. Application Data

[63] Continuation of application No. 08/678,767, Jul. 11, 1996, Pat. No. 5,862,498, which is a continuation of application No. PCT/JP95/02307, Nov. 13, 1995.

[30] Foreign Application Priority Data

Nov. 11, 1994 [JP] Japan ................................. 6-277379
Jan. 20, 1995 [JP] Japan ................................... 7-7555

[51] Int. Cl.<sup>7</sup> .................................................. G06F 165/00
[52] U.S. Cl. ............................ 701/208; 701/28; 701/207; 701/211; 701/212
[58] Field of Search ................................ 701/200, 23, 24, 701/25, 26, 27, 28, 207, 208, 209, 210, 211, 212; 340/988, 995, 998

[56] References Cited

U.S. PATENT DOCUMENTS

| | | | |
|---|---|---|---|
| 4,484,192 | 11/1984 | Seitz et al. | 340/995 |
| 4,660,157 | 4/1987 | Beckwith et al. | 395/121 |
| 4,796,191 | 1/1989 | Honey et al. | 364/449.2 |
| 5,155,683 | 10/1992 | Rahim | 364/424.029 |
| 5,161,886 | 11/1992 | De Jong et al. | 364/449 |
| 5,179,519 | 1/1993 | Adachi et al. | 364/449 |
| 5,528,735 | 6/1996 | Strasnick et al. | 395/127 |
| 5,559,707 | 9/1996 | DeLorme et al. | 340/995 |
| 5,671,381 | 9/1997 | Strasnick et al. | 395/355 |

FOREIGN PATENT DOCUMENTS

| | | |
|---|---|---|
| 1-263688 | 10/1989 | Japan . |
| 2-090191 | 3/1990 | Japan . |
| 2-267583 | 11/1990 | Japan . |
| 3-026917 | 2/1991 | Japan . |
| 3-225391 | 10/1991 | Japan . |

*Primary Examiner*—William A. Cuchlinski, Jr.
*Assistant Examiner*—Arthur D. Donnelly
*Attorney, Agent, or Firm*—Evenson, McKeown, Edwards & Lenahan, PLLC

[57] ABSTRACT

A map display apparatus according to the present invention has a control circuit which divides a display screen of a display device into a plurality of regions, and processes a bird's-eye view data for each region and convert them into map image data. The control circuit then prepares vehicle information image data for displaying marks indicating current position and destination of the vehicle. In this step, mark data are prepared so that the mark is displayed at a display position corresponding to the destination when the destination is within a display range, and so that the mark is displayed at a display position that lies in the direction of the destination and is closest to the destination when the destination is not within the display range. Upon completion of preparation of the map image data and vehicle information image data, the control circuit displays these data on the display device, and then detects the current vehicle position again. If the vehicle does not run farther than a predetermined distance, only the display position of the vehicle position mark is changed. If the vehicle runs farther than the predetermined distance, the map image data are updated. In the meantime, grid line information used for bird's-eye view display and planimetric map display is stored in advance in a grid-line information memory. The control unit selects appropriate grid line information, depending upon a screen display mode selected by an operator, so as to display the road map with grid lines superposed thereon.

14 Claims, 19 Drawing Sheets

FIG. 2A
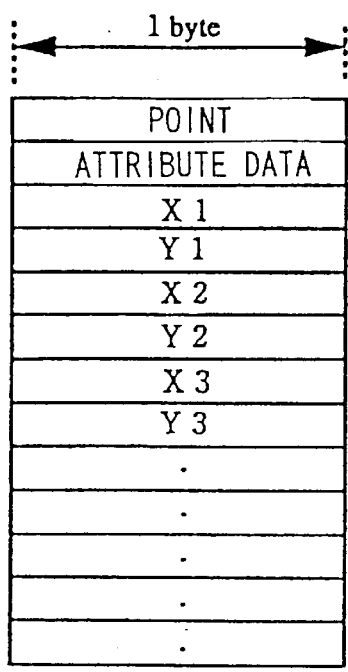
FIG. 2B
KINDS OF ROADS
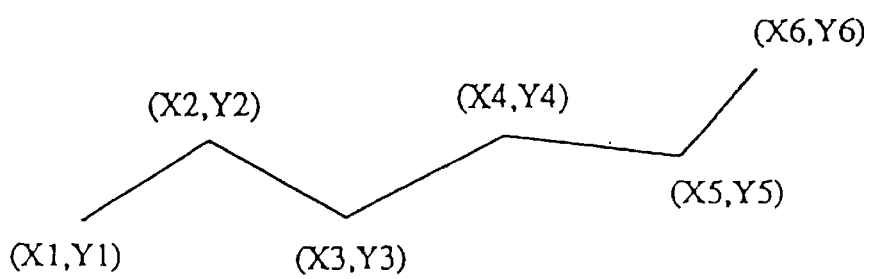
FIG. 3
(X1,Y1)  (X2,Y2)  (X3,Y3)  (X4,Y4)  (X5,Y5)  (X6,Y6)

BEFORE MOVEMENT OF A MOTOR VEHICLE

AFTER MOVEMENT OF A MOTOR VEHICLE

AFTER SIGNIFICANT CHANGE OF THE TRAVELLING DIRECTION OF A VEHICLE

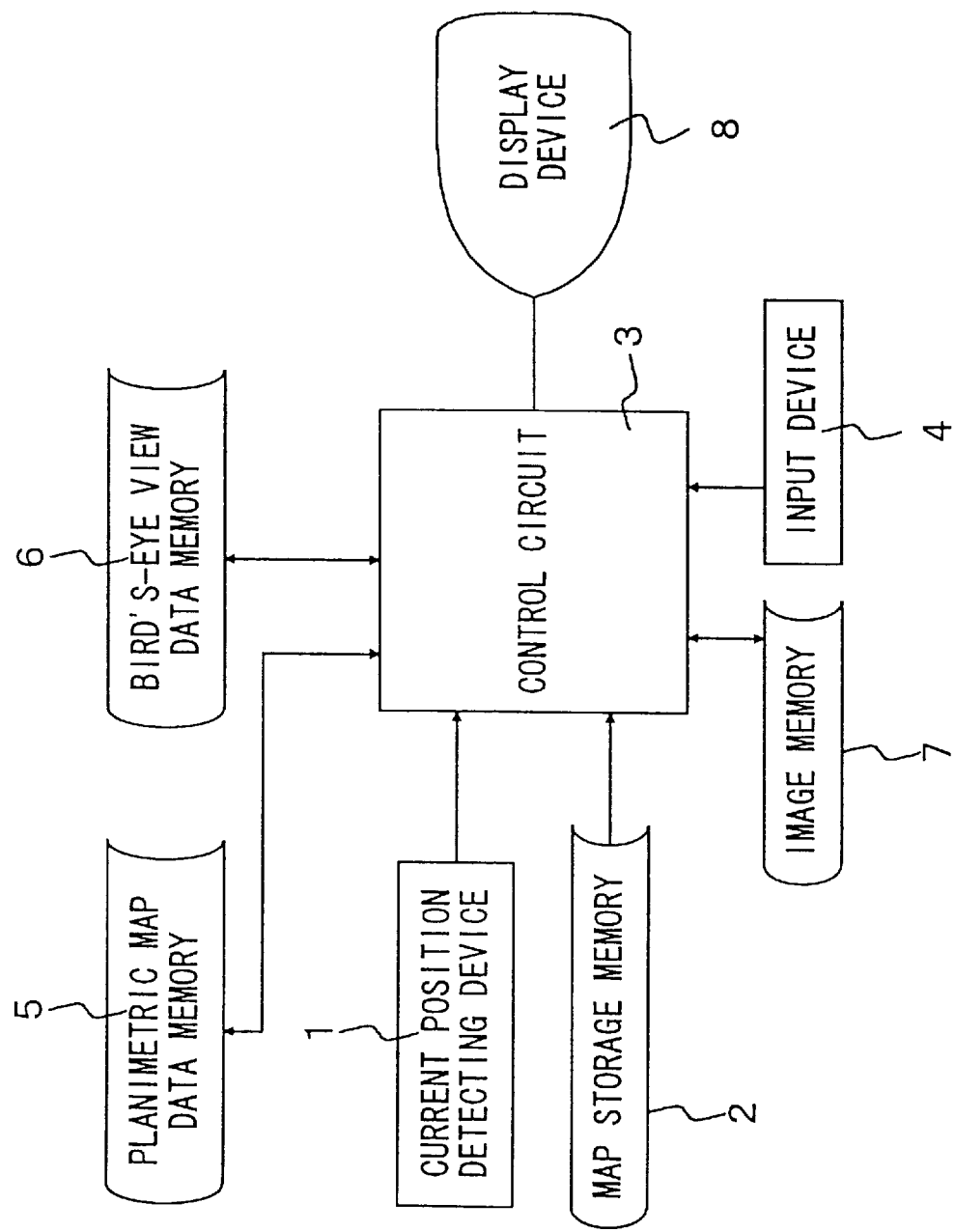

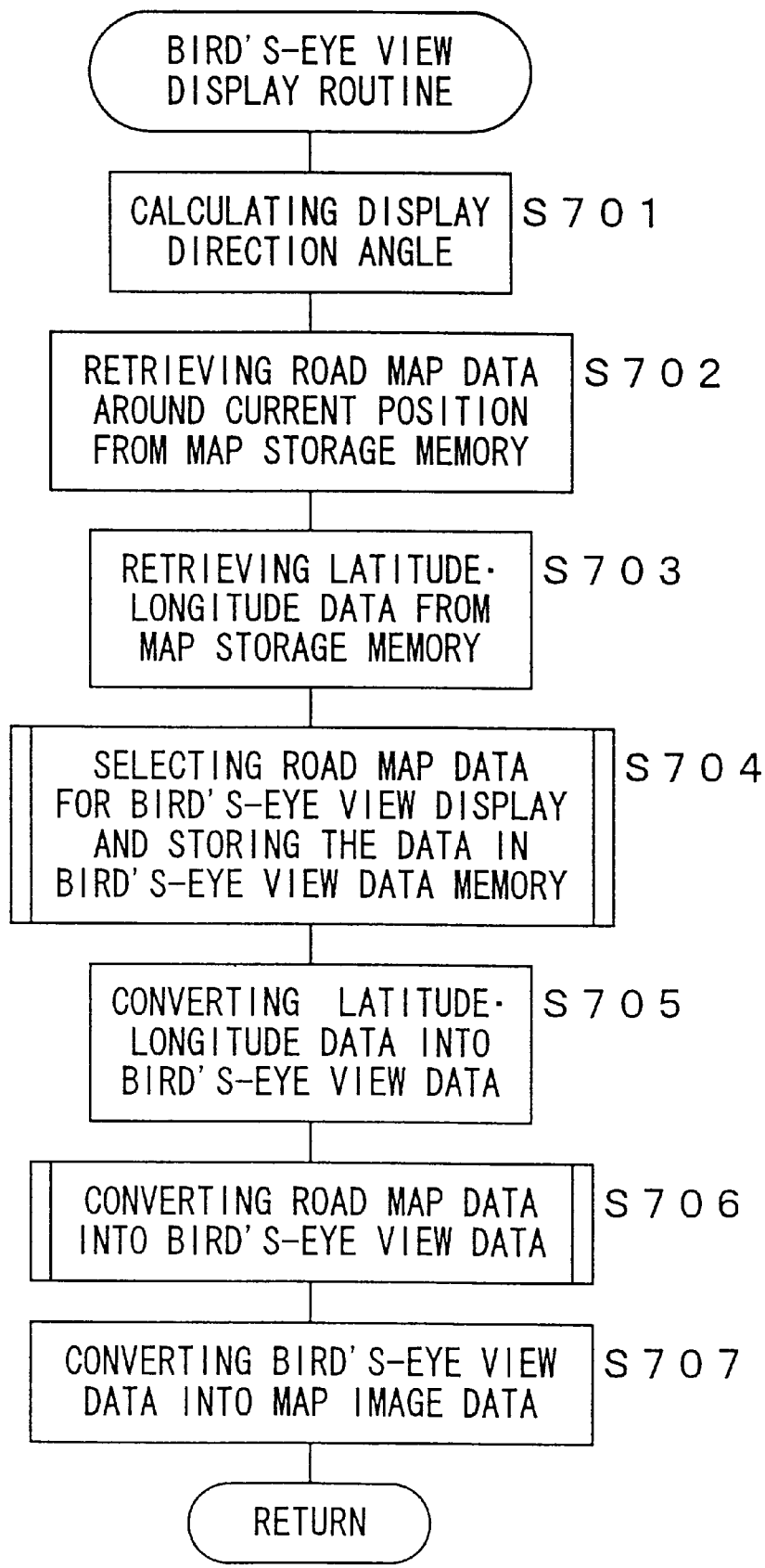

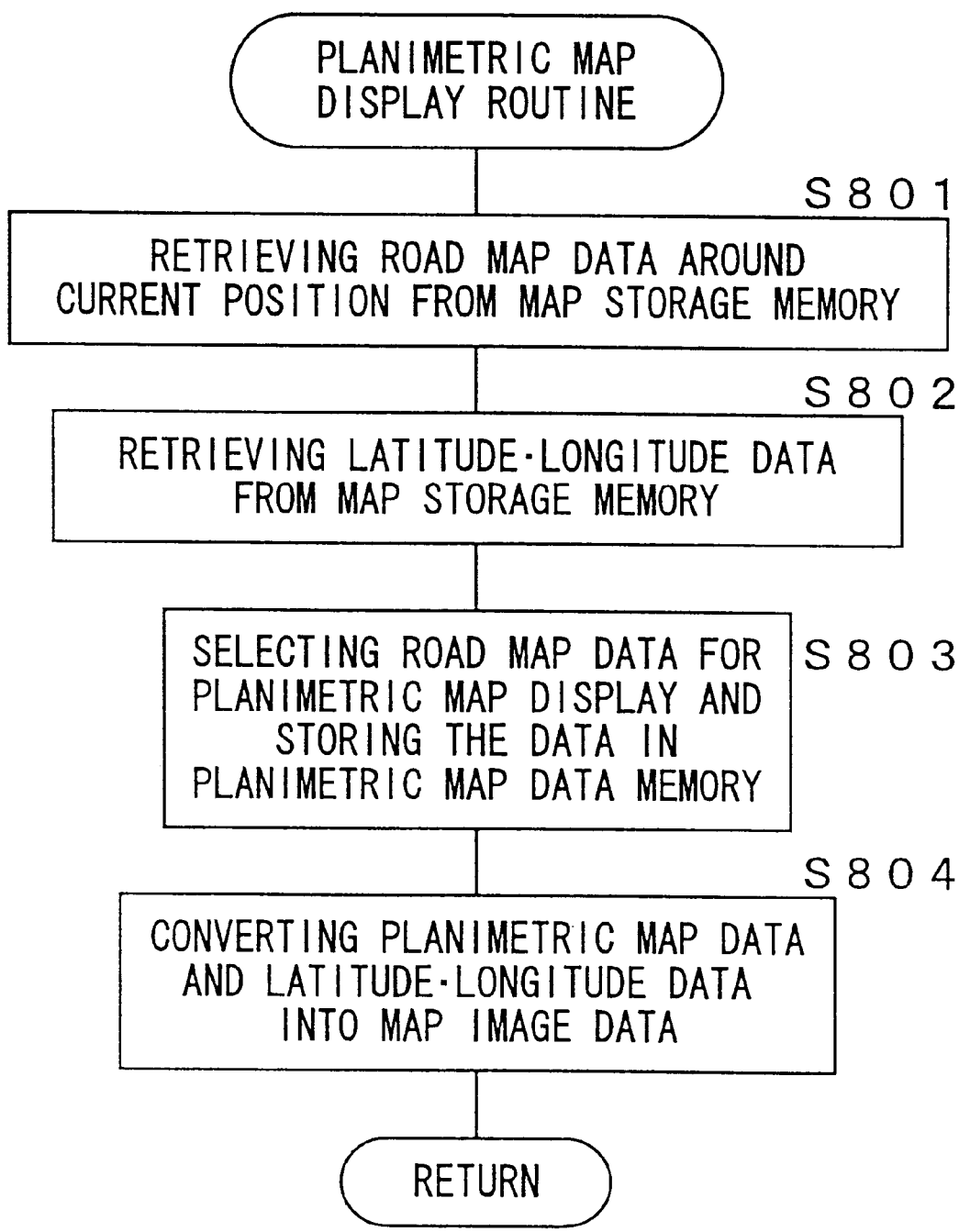

BEFORE MOVEMENT OF A MOTOR VEHICLE

AFTER MOVEMENT OF A MOTOR VEHICLE

AFTER SIGNIFICANT CHANGE OF THE TRAVELLING DIRECTION OF A VEHICLE

BEFORE COORDINATE CONVERSION
CLIPPING DATA OF SQUARE REGION INCLUDING THE TRAPEZOIDAL REGION

AFTER COORDINATE CONVERSION

COORDINATE CONVERSION OF SQUARE REGION

MAP DISPLAY APPARATUS FOR MOTOR VEHICLE

This application is a continuation of application Ser. No. 08/678,767, filed Jul. 11, 1996, now U.S. Pat. No. 5,862,498 which is a continuation of PCT Application No. PCT/JP95/02307, filed Nov. 13, 1995.

FIELD OF THE ART

The present invention relates to a map display apparatus for a motor vehicle, which is capable of displaying a road map around a vehicle position on a display device.

BACKGROUND ART

There is known a map display apparatus for a motor vehicle, which displays a road map in the form of a so-called bird's-eye view, namely, displays the road map on a display device such that the road map around the current position of the vehicle (vehicle position) is displayed in a larger scale than a far side view (refer to laid-open Publication No. 2-244188 of unexamined Japanese Patent Application, for example). The apparatus disclosed in the above-identified publication places a view point behind the current position of the vehicle, and displays a view taken by looking down the map from this view point in the travelling direction of the vehicle, on a screen of the display device. In this manner of displaying the bird's-eye view, it is possible to display map information around the current position in a larger scale, and also display a wide range of map information ranging from the current position to a distant place. This makes it easier to visually grasp conditions of junctions of roads. Further, the road map can be displayed with an increased sense of reality as if the driver himself/herself actually looked down the road map.

In the case where the original map information has a little to be displayed on the screen, as in the case of displaying a road map of a suburban area having a low density of roads, however, it is difficult to determine whether a bird's-eye view or a conventional planimetric map is being displayed, and the sense of reality as an intrinsic feature of the bird's-eye view cannot be achieved even when the bird's-eye view is displayed. Further, upon display of the road map in the bird's-eye view, the map scale is continuously varied from the lower edge of the screen toward the upper edge, making it difficult to grasp a sense of distance.

In addition, it is true of both of the bird's-eye view and the planimetric map that the size of the display screen limits a range of the road map that can be displayed on one screen. When the destination is located a remote distance away from the current position, therefore, the current position and the destination may not be displayed at the same time. If the destination is not displayed, the driver is likely to make an error in the travelling direction.

The object of the present invention is to provide a map display apparatus for a motor vehicle, which is capable of displaying a bird's-eye view that makes it easier to grasp a sense of distance and recognize the direction of the destination.

DISCLOSURE OF THE INVENTION

To accomplish the above object, the present invention is applied to a map display apparatus for a motor vehicle comprising: road map storage device which stores road map data relating to a road map; a display device capable of displaying the road map; bird's-eye view data converting circuit which converts the road map data into bird's-eye view data so that a bird's-eye view taken by obliquely looking down the road map from above is displayed on the display device; and display control circuit which displays a plurality of grid lines such that the grid lines are superposed on the bird's-eye view. Since the plurality of grid lines are displayed at the same time that the bird's-eye view is displayed, the driver can easily grasp a sense of distance, and the bird's-eye view can be displayed as if it were actually present in the world.

If a display screen of the display device is divided into regions in the vertical direction, and an image representative of the sky, instead of the road map, is displayed in at least one of the divided regions which is closest to the upper edge of the display screen, the bird's-eye view can be displayed with higher degrees of reality and stability.

The present invention is also applied to a map display apparatus for a motor vehicle comprising: road map storage device which stores road map data relating to a road map; a display device capable of displaying the road map; vehicle position detecting device which detects a current vehicle position; a destination setting circuit which sets a destination of the vehicle; bird's-eye view data converting circuit which converts the road map data into bird's-eye view data, so that a bird's-eye view taken by obliquely looking down the road map from above is displayed on the display device; determining circuit which determines whether data relating to the destination is included in the converted bird's-eye view data or not;

and display control circuit which displays a mark at a display position corresponding to the destination if an affirmative decision is obtained by the determining circuit, and displaying the mark at a certain position in a display screen of the display device, which position lies in a direction of the destination, if a negative decision is obtained by the determining circuit.

Since the mark indicating the direction of the destination is always displayed irrespective of the distance to the destination, the driver can drive while constantly being aware of the direction of the destination, and is thus prevented from getting lost.

BRIEF DESCRIPTION OF THE DRAWINGS

FIGS. 2A, 2B are views showing the data structure of road data stored in a map storage memory.

FIG. 3 is a view showing an example of the road data.

FIG. 17 is a block diagram of the second embodiment of the vehicle map display apparatus of the present invention.

FIG. 18 is a flow chart showing a bird's-eye view display routine of the second embodiment.

FIG. 19 is a flow chart showing a planimetric map display routine of the second embodiment.

BEST MODE FOR EMBODYING THE INVENTION

First Embodiment

Figure 1:
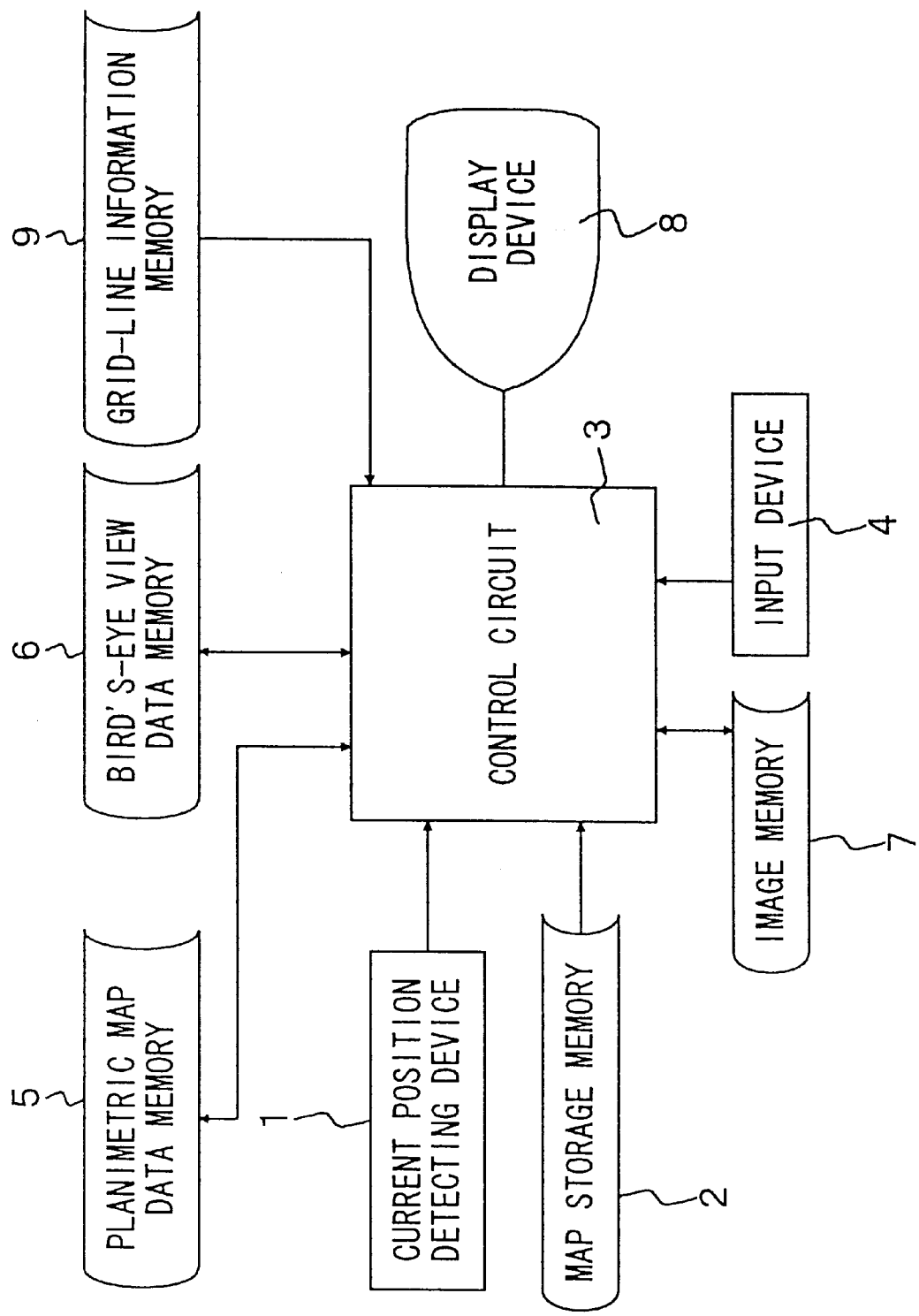
FIG. 1 is a block diagram of a map display apparatus for a motor vehicle according to the first embodiment of the present invention.

FIG. 1 is a block diagram of a map display apparatus for a motor vehicle according to the first embodiment of the present invention.

In FIG. 1, reference numeral 1 denotes a current position detecting device for detecting the current position of the vehicle, which consists of a direction sensor for detecting the travelling direction of the vehicle, a vehicle speed sensor for detecting a vehicle speed, a GPS sensor for detecting GPS signals received from a GPS (Global Positioning System) satellite, and others. Reference numeral 2 denotes a map storage memory for storing road map data, which is constituted by a mass storage medium, such as CD-ROM. The road map data stored in the map storage memory 2 consists mainly of road data, name data, background data and the like.

FIG. 2 shows the data structures of road data stored in the map storage memory 2, and FIG. 3 is a view showing an example of the road data.

As shown in FIG. 2A, the road data are stored in three different data storage regions, i.e., "point", "attribute data" and "X1, Y1 . . .". The "point" region stores the total number of data, and the "attribute data" region stores codes indicative of respective kinds of roads, as shown in FIG. 2B. The "X1, Y1 . . ." region stores coordinates representing each of the roads. In the case of the road data of FIG. 3, for example, coordinates of six points shown in the figure are stored in this region. The number of coordinates stored in the "X1, Y1 . . ." region varies depending upon the number of intersections, curves and the like.

Referring back to FIG. 1, reference numeral 3 denotes a control circuit for controlling the whole apparatus, which consists of a microprocessor and its peripheral circuits. Reference numeral 4 denotes an input device for entering the destination of the vehicle and others, and 5 denotes a planimetric map data memory that stores road map data used when a display device 8 displays a planimetric map (road map of uniform scale) obtained by viewing a road map from right above. Reference numeral 6 denotes a bird's-eye view data memory that stores road map data used for displaying a bird's-eye view, and 7 denotes an image memory that stores data of images displayed on the display device 8. The image data stored in the image memory 7 are retrieved when needed, and displayed on the display device 8. Reference numeral 9 denotes a grid-line information memory that stores information relating to grid lines to be displayed on the display device 8. For instance, the information stored in this memory 9 includes coordinates of display positions of the grid lines, and the kind or form of the grid lines to be displayed.

Figure 4:
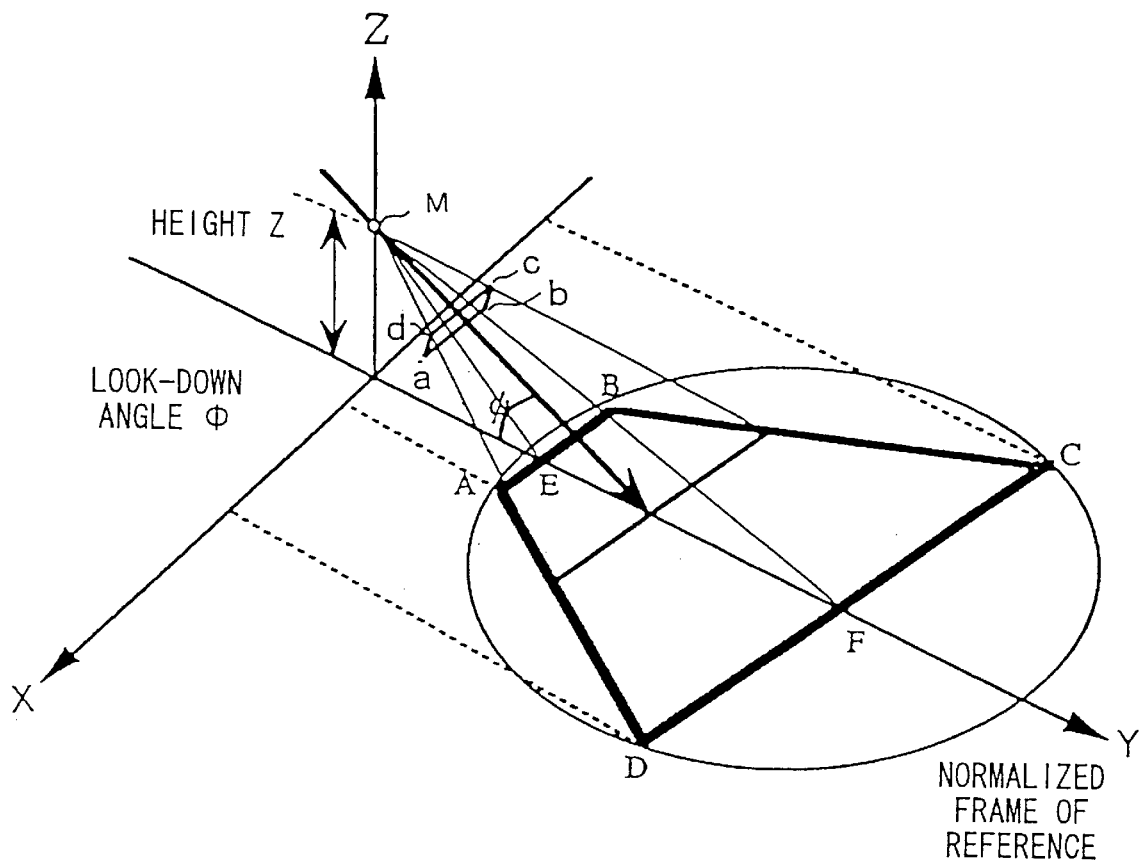
FIG. 4 is a view explaining an outline of a bird's-eye view displayed on a display device.
Figure 5:
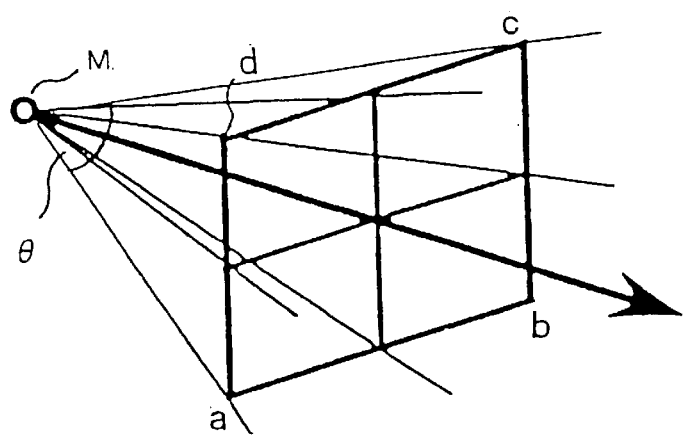
FIG. 5 is an enlarged view showing a rectangle "data" of FIG. 4.

FIG. 4 is a view explaining an outline of a bird's-eye view displayed on the display device 6. In the example of FIG. 4, a road map extends in the XY plane, and a view point M is placed on the Z axis that meets at right angles with the XY plane, so as to look down the map at an angle of Φ. A rectangle "abcd" of FIG. 4, which is shown in enlargement in FIG. 5, indicates the size of a display screen of the display device 6, and a trapezoid "ABCD" of FIG. 4 indicates a range of the road map to be displayed on the display device 6.

As shown in FIG. 4, the trapezoid "ABCD" has a far larger area than the rectangle "abcd", which follows that a wide range of the road map can be displayed by employing the bird's-eye view indication. Further, a part of the road map on the side of the lower edge ab of the display screen of the display device 6 is displayed to a larger scale than that on the side of the upper edge "cd". If the current position of the vehicle is displayed on the side of the lower edge "ab", therefore, the vicinity of the current position can be displayed in a larger scale. This enables the driver to grasp detailed road map information around the current position, and at the same time grasp a wide range of the road map spreading out in the direction of the destination.

For displaying the road map in the form of a bird's-eye view, road map data designed for bird's-eye indication may be stored in advance in the map storage memory 2, though this results in a tremendous amount of data to be stored. In the present embodiment, therefore, the ordinary road map data stored in the map storage memory 2 is converted into bird's-eye view data through software processing, for display on the display device 6. If all of the road map data are converted into the bird's-eye view data upon the conversion processing, a part of the map on the side of the upper edge of the display device 6 having a small scale is represented by too large an amount of data to be displayed. In the present embodiment, therefore, the road data, name data and background data included in the road map data are ranked in the order of priority, in view of kinds of the data, and only the data which are given high priority are displayed on the side of the upper edge of the display screen, and the data that are given low priority, as well as the data of high priority, are displayed on the side of the lower edge of the display screen.

With regard to the road data, for example, the order of priority is determined based on the kind of the road stored in the "attribute data" region of the map storage memory 2. Thus, only express highways, toll roads, national roads and prefectural roads that are classified in the higher rank of priority are displayed on the side of the upper edge of the display device 6, and general regional roads, in addition to the above-indicated roads, are displayed on the side of the lower edge of the display device 6.

Figure 6:
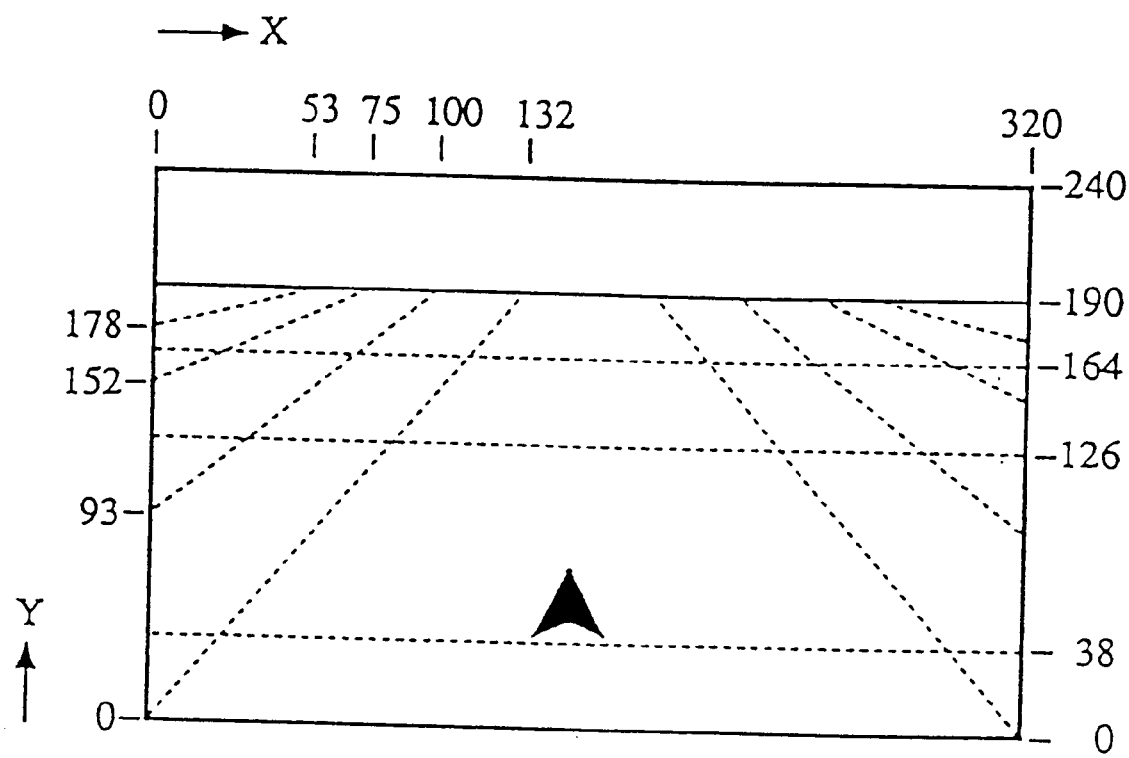
FIG. 6 is a view showing an example of grid lines displayed at the same time that a road map is displayed in the form of a bird's-eye view.

FIG. 6 is a view showing an example of grid lines which are displayed at the same time that the road map is displayed in the form of the bird's-eye view. In FIG. 6, the grid lines are displayed such that substantially the same distance on the road map is defined between adjacent grid lines. Since the map scale is continuously varied in the bird's-eye view of the road map, the spacing between the adjacent grid lines is gradually reduced from the lower edge toward the upper edge of the screen, as shown in the figure. Similarly, the spacing of the grid lines is gradually reduced from the middle part of the screen toward the left and right edges of the screen. The information for displaying the grid lines of FIG. 6 is stored in advance in the above-indicated grid-line information memory 9. In FIG. 6, numerical values appearing aside the screen indicate coordinates of display positions when the origin is placed at the lower and left end of the screen, and the triangular mark in the screen represents the current position of the vehicle.

Figure 7:
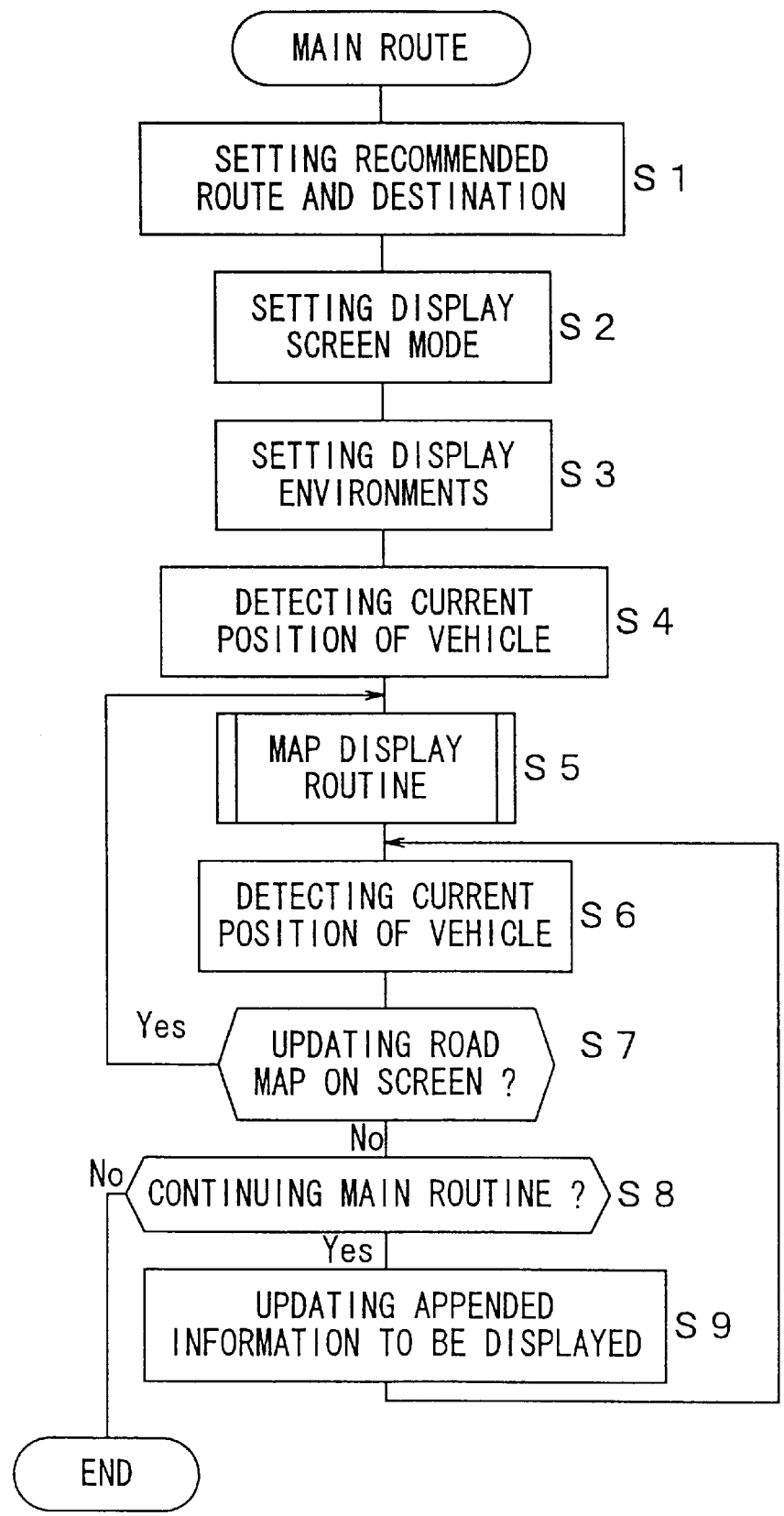
FIG. 7 is a flow chart showing a main routine of a control circuit.

FIG. 7 is a flow chart showing a main routine of the control circuit 3. In the following, the operation of the first embodiment will be explained on the basis of this flow chart. The control unit 3 initiates the routine of FIG. 7 when a key is operated to turn on an ignition switch, for example. In step S1 of FIG. 1, recommended route and destination are established. Described in more detail, the destination is determined on the basis of information entered through the input device 4, and the recommended route is determined by calculating according to a known Dykstra method, for example. The recommended route may be selected from a number of proposed recommended routes that are preliminarily stored in ROM or the like.

In the next step S2, a display screen mode is selected. The control circuit 3 has display screen modes including: a mode for displaying a bird's-eye view of the road map; a mode for displaying a planimetric map; and a mode for displaying the bird's-eye view and planimetric map at the same time. The operator selects one of these modes through the input device 4. Upon selection of the mode for displaying the bird's-eye view and planimetric map at the same time, the road map of one of these views is displayed in a base screen region having a large display area, while the road map of the other view is displayed in a window screen region as a part of the base screen.

Step S3 is then executed to establish display environments. The display environments set in this step include colors displayed on the screen, map scale of the road map to be displayed, and others. These display environments are selected by the operator through the input device 4.

In the next step S4, the current position of the vehicle is detected. Step S5 is then executed to implement a map display routine as shown in detail in FIG. 8. The map display routine will be described later in detail.

In the next step S6, the current position of the vehicle is detected in the same manner as in step S4. Step S7 is then executed to determine whether the road map on the screen should be updated or not, namely, whether the road map should be rewritten or not. In this step, it is determined to update the road map when the vehicle runs farther than a predetermined distance, or when the operator enters a command for scrolling by means of the input device 4, for example.

If an affirmative decision is obtained in step S7, the control flow returns to step S5. If a negative decision is obtained in step S7, step S8 is then implemented to determine whether the main routine of FIG. 7 is continued or not. A negative decision is obtained in step S8 if a power switch that is not shown in the figure is turned off, or when a switch is operated to cancel the routine, and the main routine of FIG. 7 is terminated.

If an affirmative decision is obtained in step S8, the control flow goes to step S9 to update the appended information to be displayed, and then returns to step S6. The appended information mentioned herein may include a vehicle position mark displayed at a position corresponding to the current position of the vehicle. The control flow returns to step S6 after the display position of the appended information, such as the vehicle position mark, is changed in the above step S9 according to the travel distance of the vehicle. In the case where such vehicle position marks are displayed on both the base screen and the window screen, the display positions of both of the vehicle position marks are changed.

Figure 8:
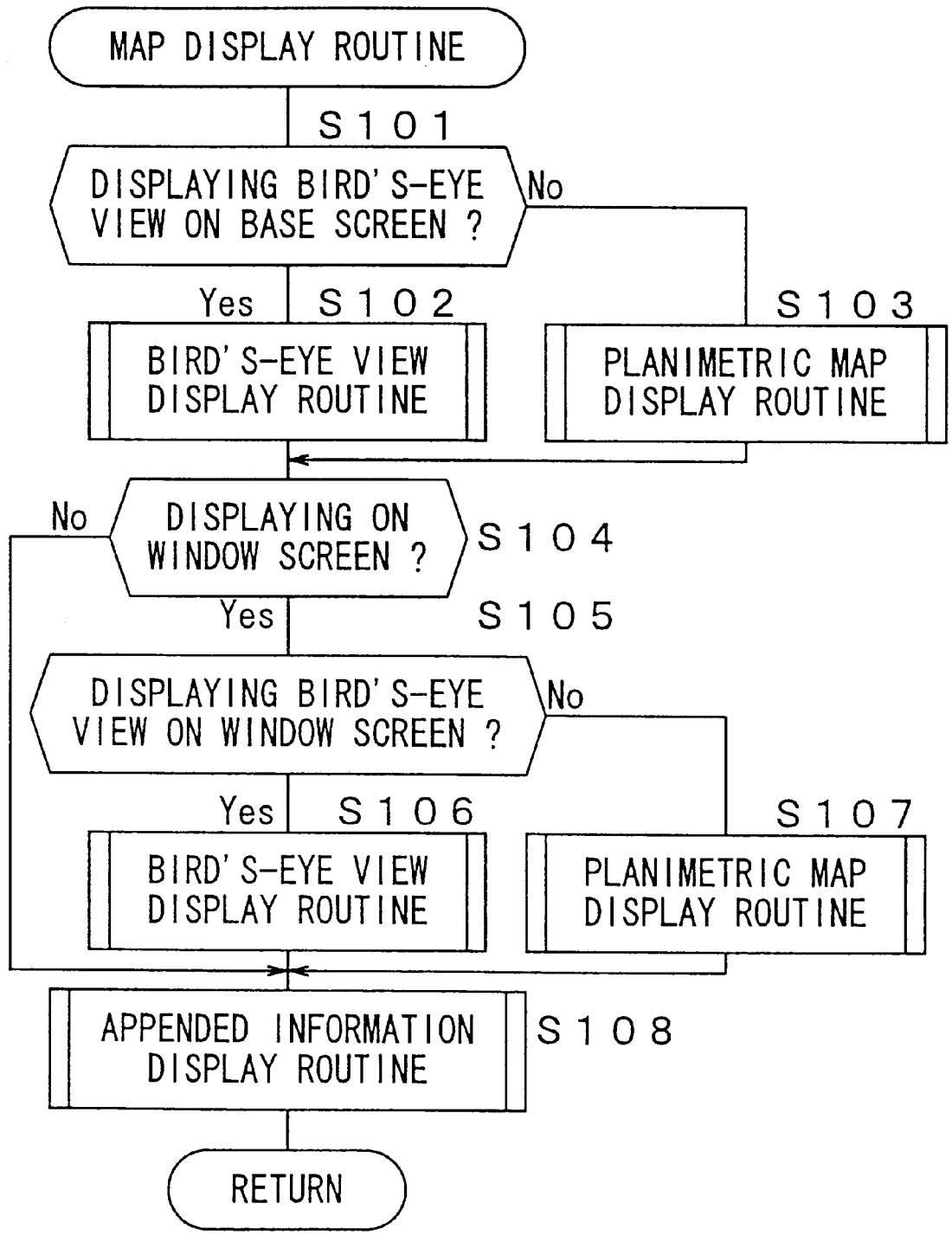
FIG. 8 is a flow chart showing in detail a map display routine of step S5 of FIG. 3.

FIG. 8 is a detailed flow chart of the map display routine of step S5 of FIG. 3. In step S101 of FIG. 8, it is determined whether the road map to be displayed on the base screen is in the form of a bird's-eye view or not. This determination is effected on the basis of the display screen mode selected in step S2 of FIG. 7. If an affirmative decision is obtained in step S101, step S102 is then executed to effect a bird's-eye view display routine as shown in detail in FIG. 9, so that the bird's-eye view is displayed in the base screen region on the screen.

Figure 14:
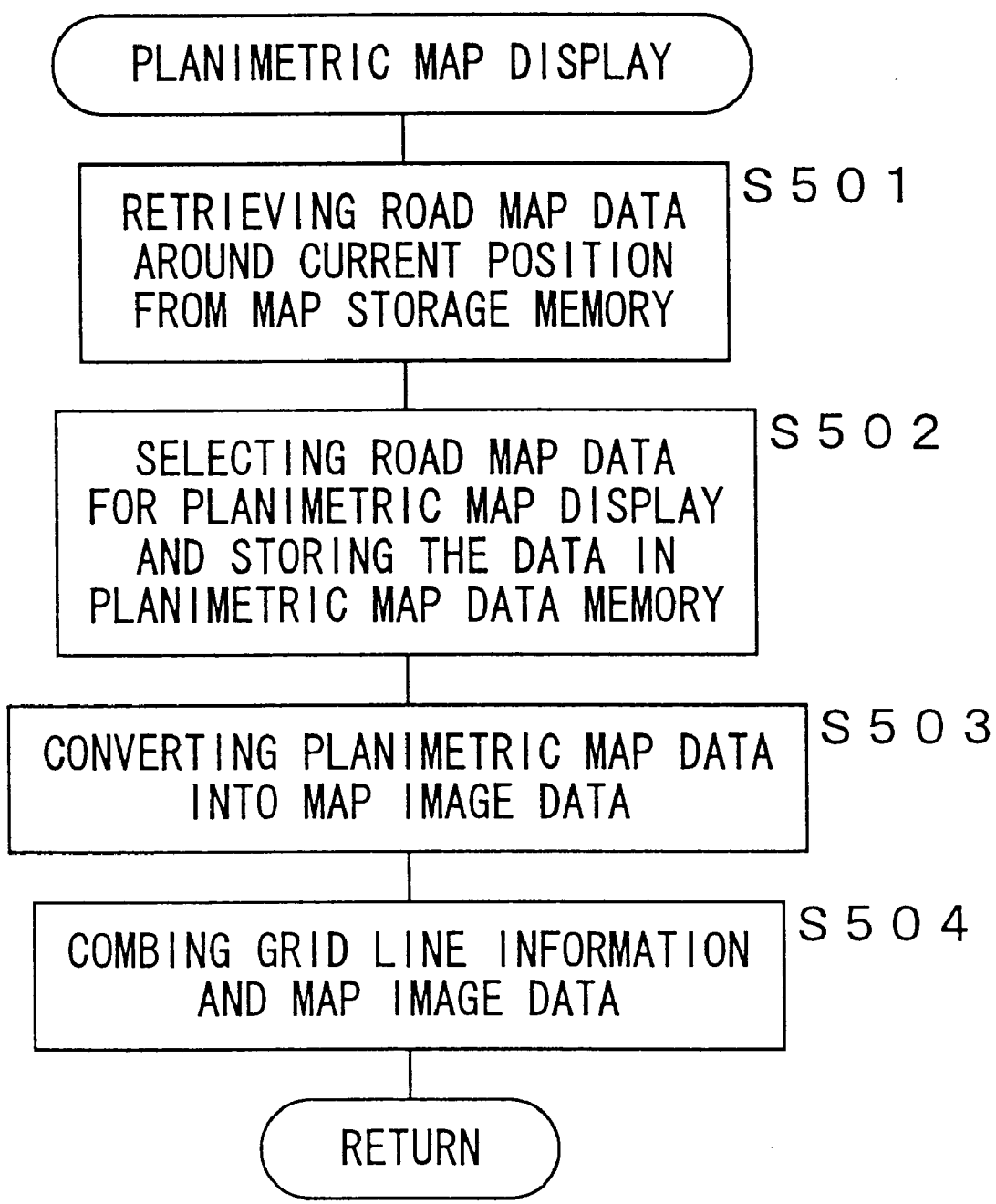
FIG. 14 is a flow chart showing in detail a planimetric map display routine of step S103 of FIG. 8.

If a negative decision is obtained in step S101, on the other hand, the control flow goes to step S103 to implement a planimetric map display routine as shown in detail in FIG. 14, so that the bird's-eye view is displayed in the base screen region on the screen.

Upon completion of the routine of step S102 or S103, step S104 is then executed to determine whether a display is provided on the window screen or not. This determination is effected on the basis of the display screen mode selected in step S3 of FIG. 7.

If an affirmative decision is obtained in step S104, the control flow goes to step S105 to determine the road map displayed on the window screen is in the form of a bird's-eye view or not. This determination is also effected on the basis of the display screen mode selected in step S2 of FIG. 7. If an affirmative decision is obtained in step S105, step S106 is then executed to implement the bird's-eye view display routine as shown in detail in FIG. 9 so as to display the bird's-eye view in the window screen. If a negative decision is obtained in step S105, on the other hand, step S107 is then executed to implement the planimetric view display routine as shown in detail in FIG. 14 so as to display the planimetric view in the window screen.

Figure 15:
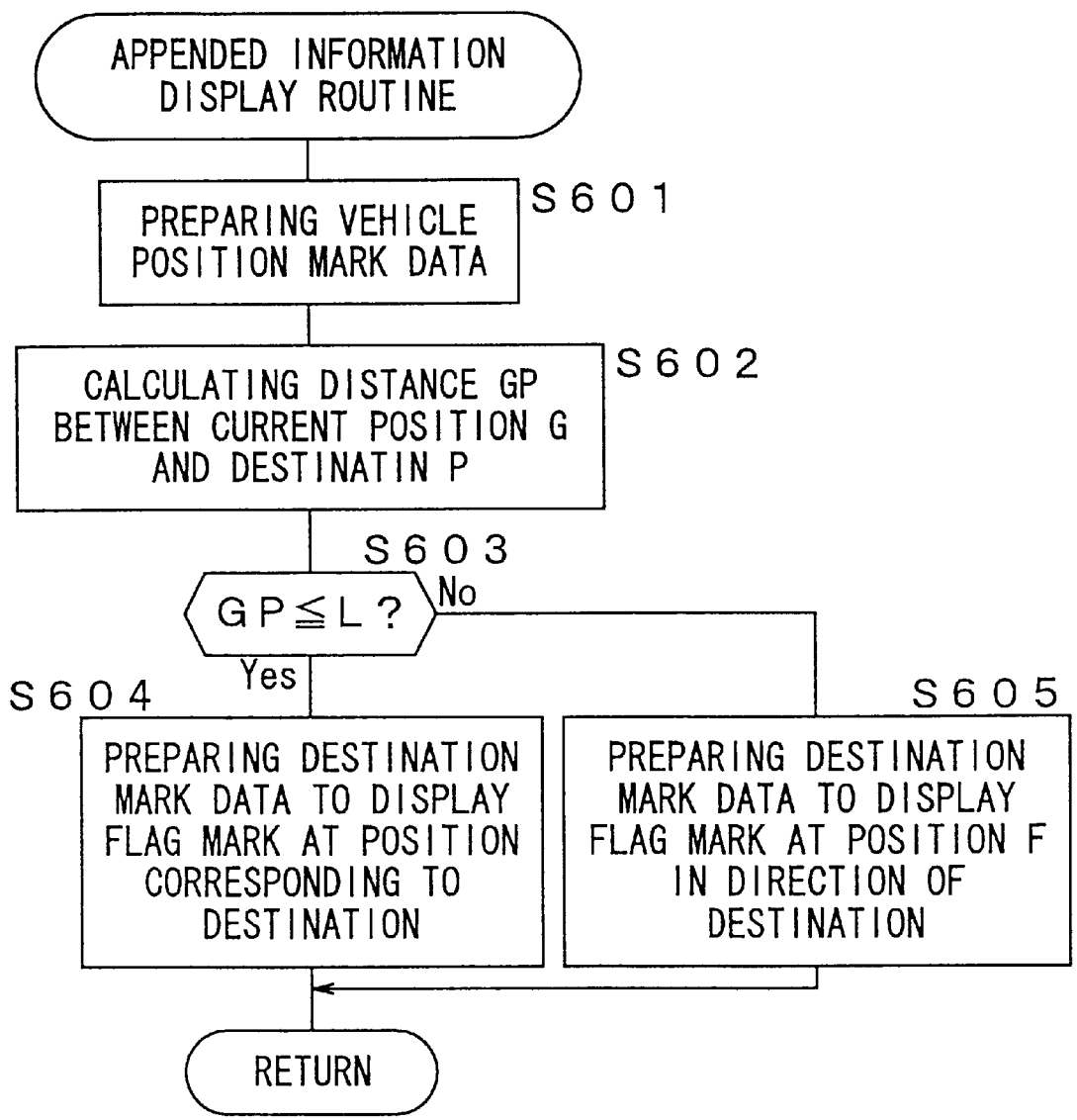
FIG. 15 is a flow chart showing in detail an appended information display routine of step S108 of FIG. 8.

When the routine of step S106 or S107 is terminated, or when a negative decision is obtained in step S104, step S108 is executed to implement an appended information display routine as shown in detail in FIG. 15, so that appended information, such as a vehicle position mark, is displayed on both the base screen and window screen, and the control flow returns to the main routine. Step S108 will be described later in detail.

Figure 9:
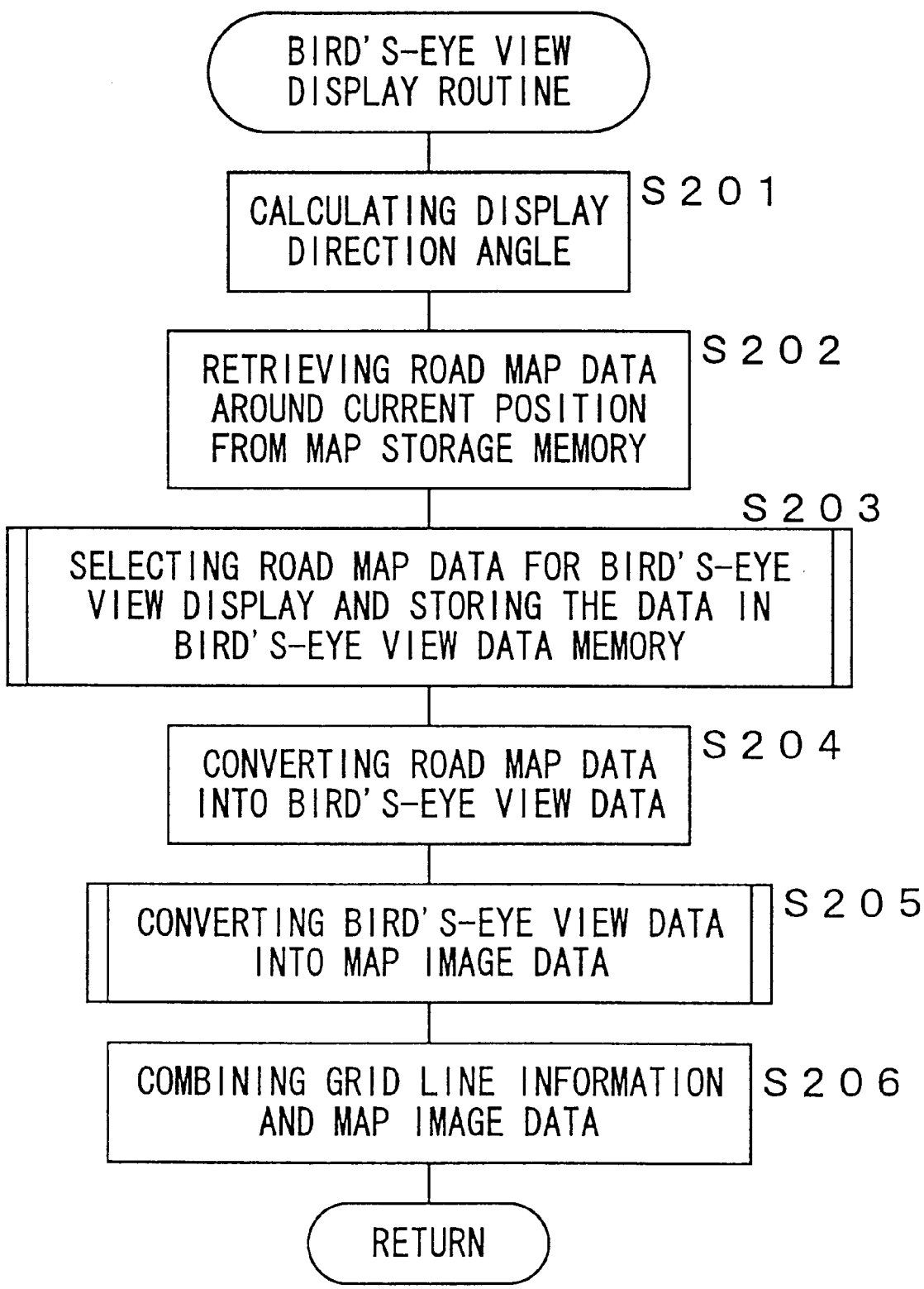
FIG. 9 is a flow chart showing in detail a bird's-eye view display routine of step S102 or S103 of FIG. 8.

FIG. 9 is a detailed flow chart of the bird's-eye view display routine of step S102 or S106 of FIG. 8. In step S201 of FIG. 9, a display direction angle used for display of the bird's-eye view is calculated.

Figure 10:
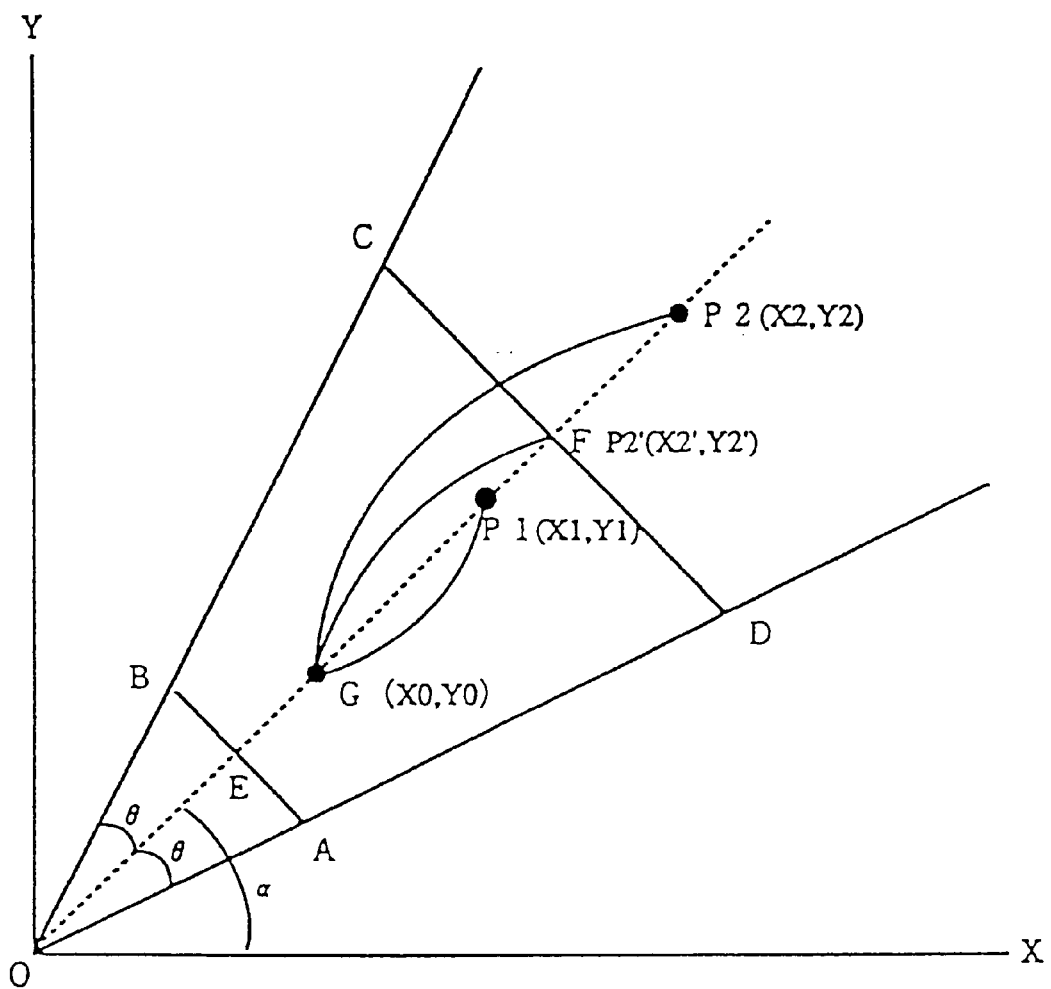
FIG. 10 is a view explaining a method of calculating a display direction angle $\alpha$.

FIG. 10 is a view explaining a method for calculating the display direction angle $\alpha$. The XY axes shown in the figure define a road map plane in which the origin O represents the departure point of the vehicle, and the coordinates G (X0, Y0) represent the current position of the vehicle, while the coordinates P1 (X1, Y1) represent the destination.

As shown in the figure, the display direction angle $\alpha$ is an angle formed by a segment (indicated by a dotted line in the figure) connecting the current position G and the destination P1, and the X axis, and is represented by the equation (1).

$$\tan \alpha = \{(Y1-Y0)/(X1-X0)\} \quad (1)$$

In the above-described step S201, the display direction angle α is obtained on the basis of the equation (1).

In the next step S202, the road map data around the current position is retrieved from the map storage memory 2 on the basis of the current position detected in step S4 of FIG. 7, and the display direction angle α calculated in step S201. For example, the road map data is retrieved with respect to an area within a several tens of kilometers square including the current position.

Figure 11:
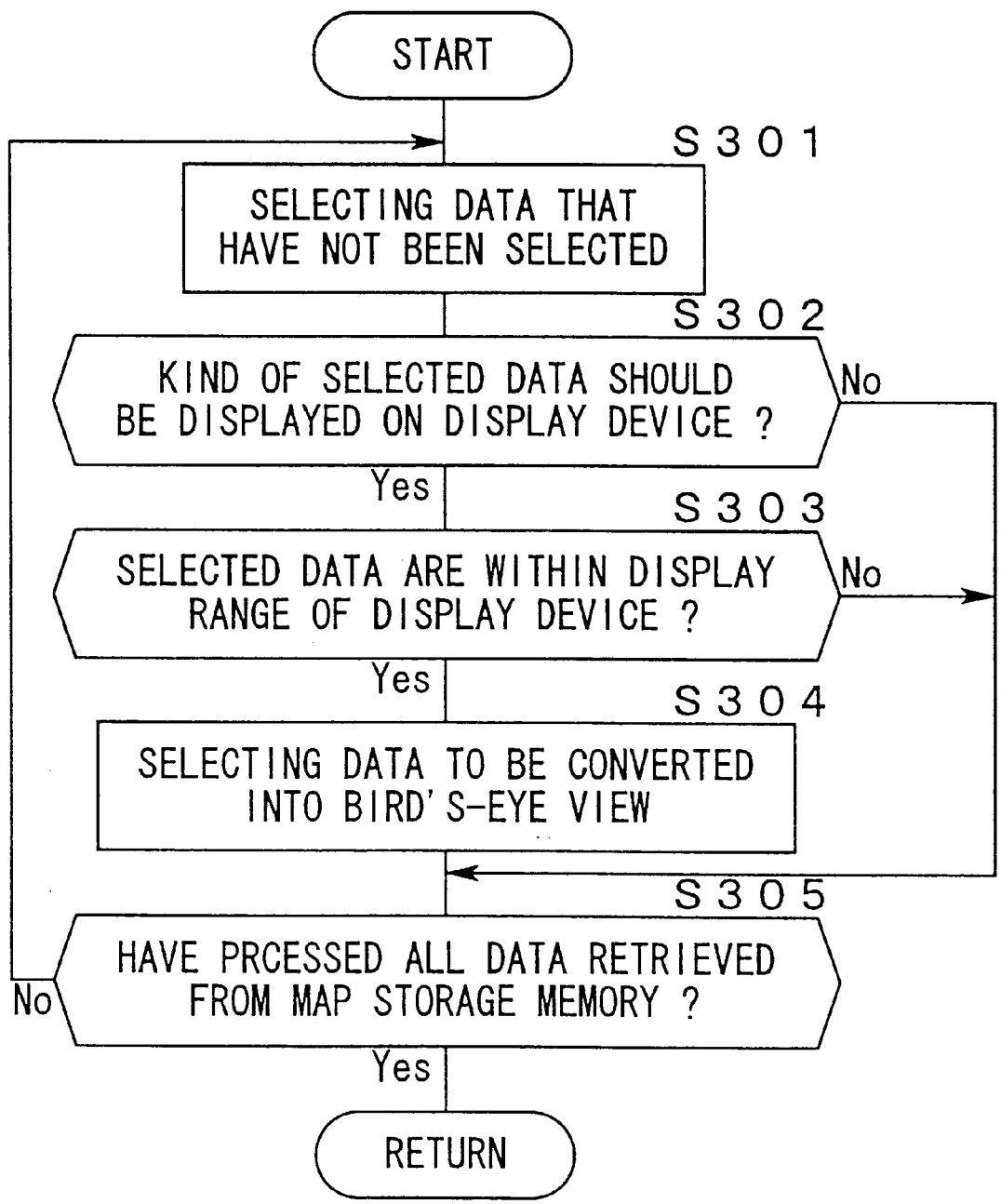
FIG. 11 is a flow chart showing in detail the processing of S203 of FIG. 9.

In the next step S203, data used for displaying the bird's-eye view are selected from the road map data retrieved in step S202, and the selected data are stored in the bird's-eye view data memory 6 as detailed in FIG. 11. The processing of step S203 will be described later in detail. In the next step S204, the road map data selected in step S203 is converted into bird's-eye view data.

Figure 12:
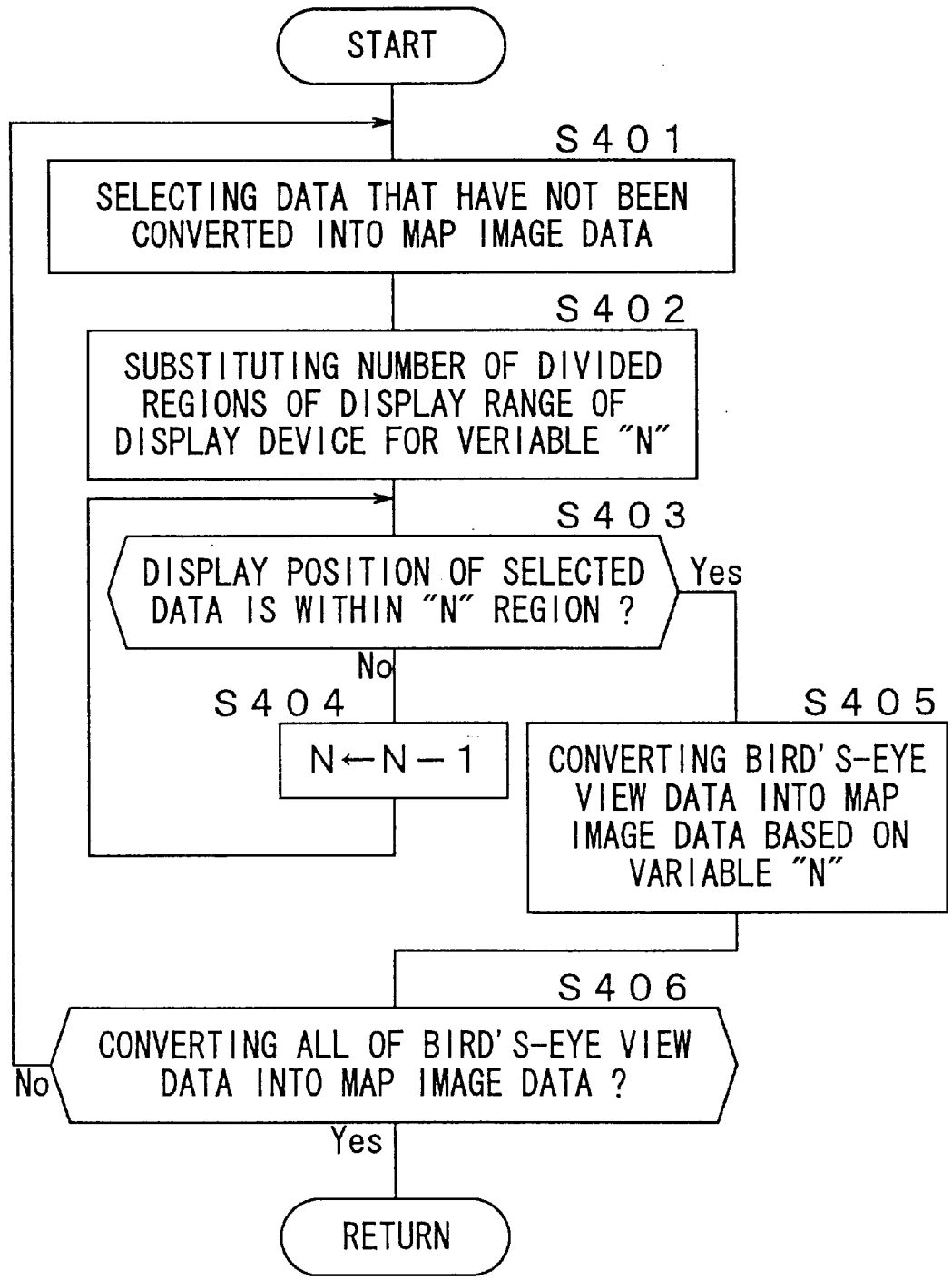
FIG. 12 is a flow chart showing in detail the processing of S205 of FIG. 9.

In the next step S205, the bird's-eye view data obtained in step S204 is converted into map image data for displaying final images on the display device 8 as detailed in FIG. 12. The processing of step S205 will be described later in detail. In the next step S206, grid-line information used for display of the bird's-eye view is retrieved from the grid-line information memory 9, and combined with the map image data. The combined data is then stored in the image memory 7, and the control flow returns to the map display routine.

FIG. 11 is a detailed flow chart of the processing of step S203 of FIG. 9. In step S301 shown in the figure, data that have not been processed in step S302 and subsequent steps (which will be explained) are selected from the road map data retrieved in step S202 of FIG. 9. Step S302 is then executed to determine whether the kind of the data selected in step S301 is one of those kinds which should be displayed on the display device 6. In the case where the data selected in step S301 are road data, for example, it is determined whether the road data represent a kind of road whose order of priority is above that of national roads or not. As a result of the processing of this step S302, the amount of the road map data displayed on the display device 6 is reduced.

If an affirmative decision is obtained in step S302, step S303 is then executed to determined whether the data selected in step S301 are within a range that is to be displayed on the display device 6 or not. Namely, it is determined whether the data selected in step S301 is in the range of the trapezoidal area "ABCD" of FIG. 4.

If an affirmative decision is obtained in step S303, step S304 is then executed to select the data selected in step S301 as data to be converted into bird's-eye view data.

When the processing of step S304 is completed, or when a negative decision is obtained in step S302, or when a negative decision is obtained in step S303, step S305 is then executed to determine whether all of the data retrieved from the map storage memory 2 in step S302 of FIG. 9 have been processed according to steps S301–S304 or not, and the control flow returns to the bird's-eye view display routine if an affirmative decision is obtained. If a negative decision is obtained, the control flow goes back to step S301.

In the above-described processing of FIG. 11, the control circuit 3 filters the road map data retrieved from the map storage memory 2, so as to extract only the data of such kinds that satisfy given requirements, and then select the data used for bird's-eye view indication from the extracted data.

FIG. 12 shows a detailed flow chart of the processing of step S205 of FIG. 9. In step S401 of FIG. 12, such data that have not been converted into map image data are selected from the bird's-eye view data obtained as a result of the processing of step S204 of FIG. 9. In the next step S402, the display range of the display device 6 is divided into a plurality of regions, and the number of the divided regions is substituted for variable N.

Figure 13:
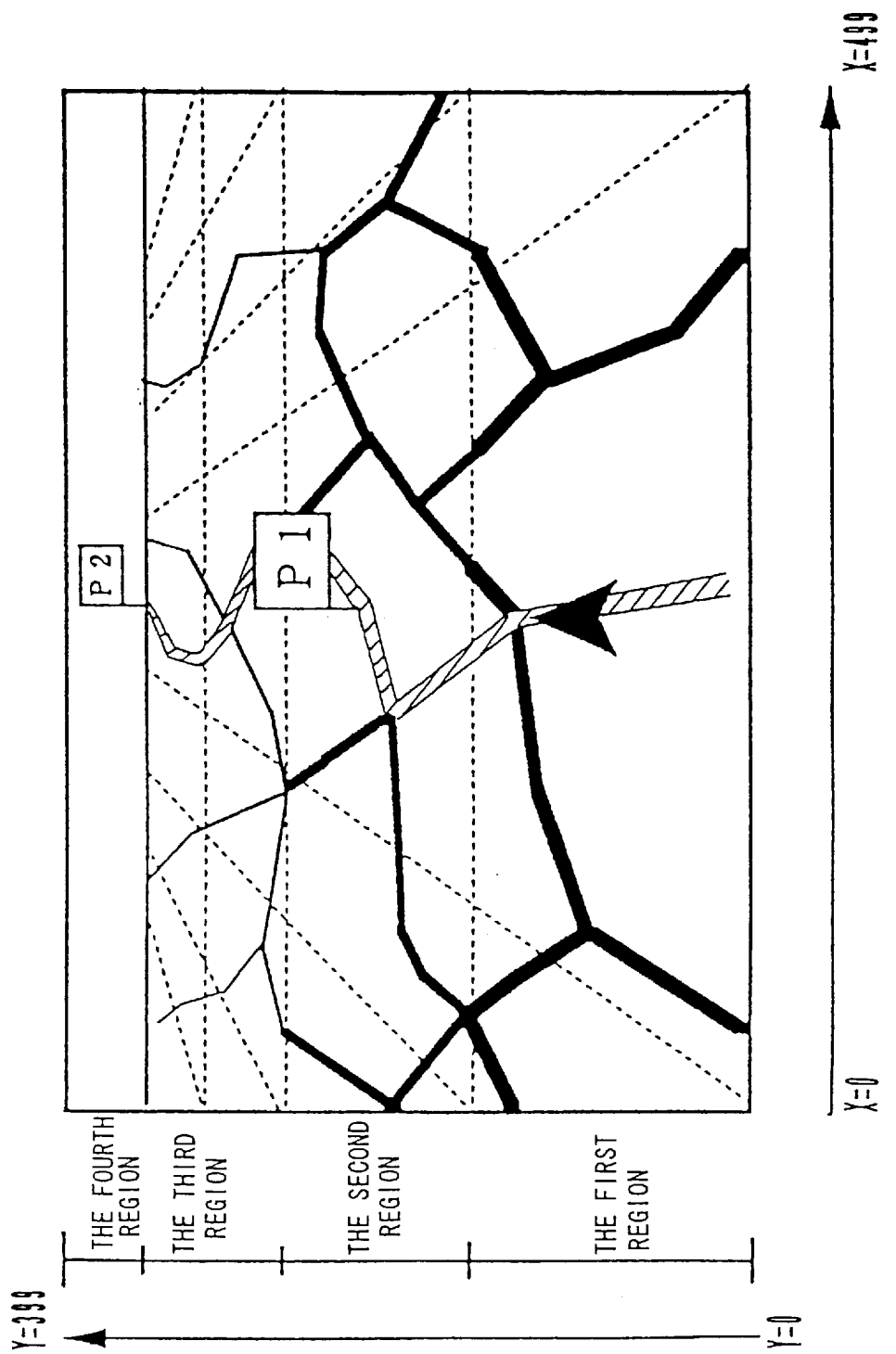
FIG. 13 is a view explaining divided regions in a display screen.

As shown in FIG. 13, the display device 6 of the present embodiment has a display screen having 500 dots in the X-axis direction and 400 dots in the Y-axis direction. This display screen is divided into four regions in the vertical direction, and the origin of the coordinates is located at the left, lower corner of the display screen. In the following description, the first region represents an area in which the coordinates in the Y-axis direction are in the range of 0 to 199 dots, and the second region represents the range of 200 to 299 dots. The third region covers the range of 300 to 349 dots, and the fourth region covers the range of 350 to 399 dots.

In step S403 of FIG. 12, it is determined whether the display position of the data selected in step S401 is within the N region or not. If a negative decision is obtained, step S404 is then executed to subtract 1 from the variable N to update N, and the control flow returns to step S403.

If an affirmative decision is obtained in step S403, step S405 is then executed to convert the bird's-eye view data into map image data, on the basis of the value of valuable N. For example, lines representing roads in the first region have a width of 4 points, and lines representing roads in the second region have a width of 2 points, while lines representing roads in the third region have a width of 1 point. The map image data may be produced such that an image representative of the sky (for example, blue or bluish image) is displayed in the fourth region, instead of the road map. In this case, the display color of the fourth region may be changed from day to night. That is, the image may be displayed with a bright color by day, and with a dark color by night.

In the next step S406, it is determined whether all of the bird's-eye view data have been converted into map image data. If a negative decision is obtained, the control flow goes back to step S401. If an affirmative decision is obtained, the control flow returns to the bird's-eye view display routine.

In the above-described processing of FIG. 12, the display range of the display device 6 is divided into a plurality of regions, and the form of display of the bird's-eye view data is changed for each of the regions. Accordingly, an increased sense of three-dimensional bird's-eye view can be displayed, making it easier for the operator to grasp a feeling of distance. In particular, the bird's-eye view is given further increased presence if the image representing the sky rather than the road map is displayed in the fourth region closest to the upper edge of the display device.

FIG. 14 is a detailed flow chart of the planimetric map display routine of step S103 of FIG. 8. In step S501 of FIG. 14, the road map around the current position of the vehicle is retrieved from the map storage memory 2. In the next step S502, data used for planimetric map indication are selected from the road map data retrieved in step S501, and the selected data is stored as planimetric map data in the planimetric map data memory 5. In this step S502, data sorted in the relatively high rank of priority or the like is selected in the same manner as in step S203 of FIG. 9.

In the next step S503, the planimetric map data stored in the planimetric map data memory 5 are converted into map image data. In the next step S504, grid-line information used for planimetric map indication is retrieved from the grid-line information memory 9, and combined with the map image data. Thereafter, the combined data is stored in the image memory 7, and the control flow returns to the map display routine.

FIG. 15 is a detailed flow chart of the appended information display routine of step S108 of FIG. 8. In step S601 of FIG. 15, vehicle position mark data are prepared to display a triangular mark as shown in FIG. 13 at a display position corresponding to the current position G of the vehicle. In the next step S602, a distance GP between the current vehicle position G and the destination P is obtained. Step S603 is then executed to determine whether the distance GP is equal to or smaller than a predetermined distance L. The predetermined distance L is a distance between the current position G and a point of intersection F at which a segment connecting the current position G and the destination P intersects with the display range "ABCD" of the road map, as shown in FIG. 10. Namely, it is determined in step S603 whether the destination P is within the range of display of the display device 6.

If an affirmative decision is obtained in step S603, the control flow goes to step S604 to prepare destination mark data so as to display a flag mark P1 as shown in FIG. 13 at a display position corresponding to the destination P. The control flow then returns to the map display routine. If a negative decision is obtained in step S603, step S605 is then executed so that the control circuit 3 prepares destination mark data so as to display the flag mark P2 at the point of intersection F shown in FIG. 10.

When the destination mark data is prepared in the above step S604 or S605, the size of the flag mark is changed depending upon the display position of the destination. For example, the flag mark has the largest size when the destination is within the first region of FIG. 13. Then, the flag mark has the second largest size when the destination is within the second region, and has the smallest size when the destination is within the third region. FIG. 13 shows flag marks having respective display sizes, which are located in the second and third regions.

As described above, the fourth region may be used to display the image representing the sky. Therefore, the above-described predetermined distance L may be made a little shorter than the distance from the current position G to the point of intersection F of FIG. 10, so that the flag mark is not displayed in the fourth region. In this arrangement, the flag mark is not displayed in the fourth region, and is displayed in any one of the first through third regions on which the road map is displayed, thus allowing an easy view of the road map on the screen.

In the above-described routine of FIG. 15, the flag mark is displayed at the display position corresponding to the destination when the destination is present within the range of display of the display device 6. When the destination is outside the display range, the flag mark is displayed at a display position on the display screen, which lies in the direction of the destination and is closest to the destination. In this arrangement, the flag mark can be displayed irrespective of the distance from the current position to the destination, permitting the driver to be always aware of the direction of the destination. Since the size of the flag mark is changed depending upon the display position on the display screen, the flag mark does not interfere with indication of the other map information.

Figure 16A:
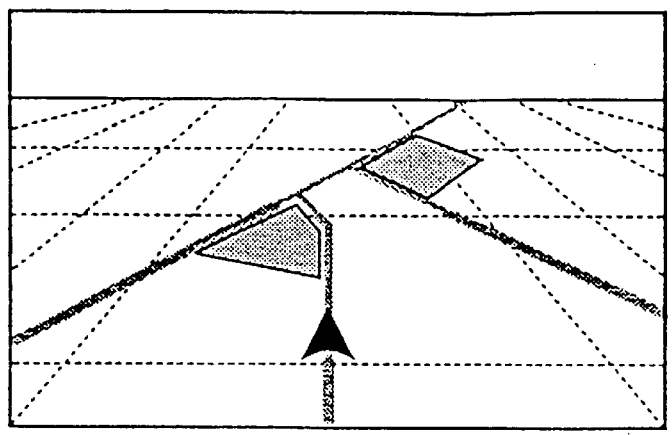
FIGS. 16A through 16C are views showing screen display examples according to the first embodiment.
Figure 16B:
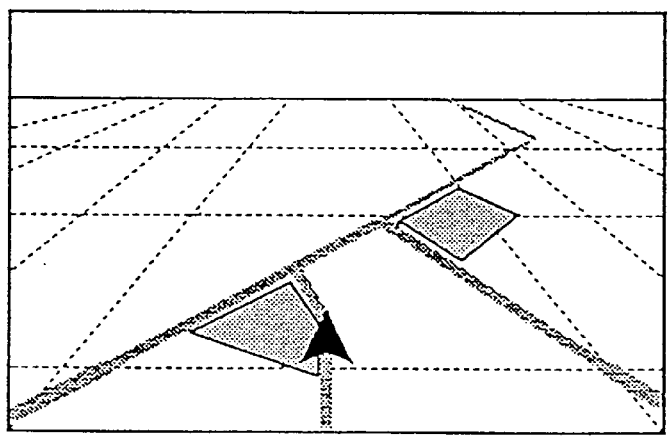
Figure 16C:
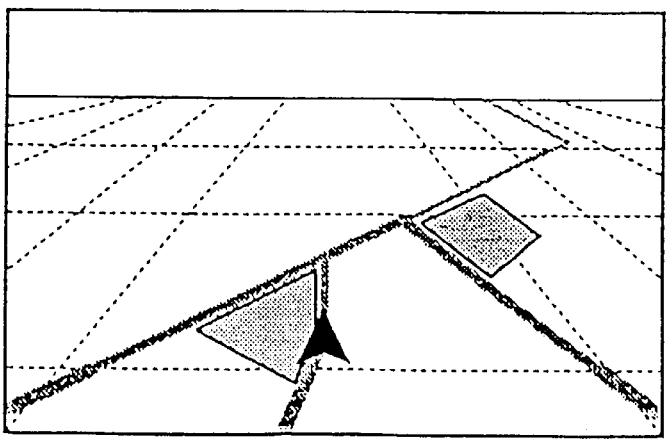

FIG. 16 are views showing examples of screen display according to the first embodiment, wherein FIG. 16A is a display example taken before movement of a motor vehicle, and FIG. 16B is a display example taken after the vehicle moves a given distance in a travelling direction, while FIG. 16C is a display example taken upon a significant change of the travelling direction of the vehicle. In any example of FIGS. 16A–16C, grid lines are displayed at the same positions on the screen. The grid lines are indicated by dotted lines in the figures. The flag mark indicating the destination is displayed in a size that becomes larger as the vehicle approaches the destination.

The operation of the first embodiment as explained above will be described in short. When the vehicle starts running, the control circuit 3 detects the current position of the vehicle, and calculates the display direction angle used for the bird's-eye view indication, from the positional relationship between the current position and the destination. Then, the control circuit 3 retrieves appropriate road map data from the map storage memory 2, on the basis of the current position, destination and the display direction angle. The retrieved road map data are then filtered to extract data of such kinds that satisfy given requirements, and the extracted data are converted into bird's-eye view data.

Subsequently, the control circuit 3 divides the display screen of the display device 6 into a plurality of regions, and the bird's-eye view data are processed for each region, to be converted into map image data. For example, some roads present in the region near the lower edge of the display screen are represented by lines having a large width, and other roads present in the region near the upper edge of the display screen are represented by lines having a small width.

In the next step, the control circuit 3 prepares vehicle information image data for displaying marks indicating the current vehicle position and the destination. In this step, the mark data are prepared so that the mark is displayed at a display position corresponding to the destination when the destination is within a range of display, and so that the mark is displayed at a display position that lies in the direction of the destination and is closest to the destination, when the destination is located outside the display range.

Upon completion of preparation of the map image data and the vehicle information image data, the control circuit 3 displays these data on the display device 6, and then detects the current vehicle position again. If the vehicle does not run farther than a predetermined distance, only the display position of the vehicle position mark is changed. If the vehicle runs farther than the predetermined distance, the map image data are updated.

In the meantime, grid line information used for bird's-eye view indication and planimetric map indication are stored in advance in the grid line information memory 9. The control circuit 3 selects appropriate grid-line information in accordance with the screen display mode selected by the operator, and, when the road map is displayed, the selected grid lines are also displayed as superposed on the road map.

Thus, according to the first embodiment, the grid lines are displayed at an interval of a given distance on the road map, to allow the operator to easily grasp a sense of distance, while displaying the bird's-eye view with increased reality. Since the grid lines are always displayed at fixed display positions, the grid lines need not be rewritten even when the road map on the screen is scrolled. Thus, the grid lines can be displayed without affecting the speed of updating the map. Further, even when the destination is located at such a remote distance that it is not displayed on the screen, the flag mark indicating the destination is displayed at a certain position on the screen which lies in the direction of the destination. This allows the driver to drive with a constant grasp of the direction of the destination, without getting lost. Since the size of the flag mark indicating the destination is varied depending upon its display position, the flag mark does not interfere with indication of other map information. Moreover, the display range of the display device 6 is divided into a plurality of regions, and data to be displayed are selected for each of the regions, depending upon the kind of the data. Accordingly, detailed map information can be displayed around the current position, and only important map information can be displayed in the region closer to the destination, thus allowing an easy view of the road map on the display screen. In addition, the bird's-eye view is given a touch of three dimensions since the control circuit 3 changes the line width of roads for each region on the display screen.

Second Embodiment

In the second embodiment, lines of latitudes or parallels and lines of longitudes or meridians on a road map are displayed as grid lines.

FIG. 17 is a block diagram of the second embodiment of the vehicle map display apparatus of the invention. As shown in FIG. 17, the second embodiment is identical with the first embodiment as shown in FIG. 1 except that the second embodiment does not have a grid line information memory. Of various routines implemented by the control circuit 3, only the bird's-eye display routine and planimetric map display routine are different from those of the first embodiment. In the following description, therefore, the bird's-eye display routine and planimetric map display routine will be mainly explained.

In the map storage memory 2 of the second embodiment, there are stored information relating to the latitudes and longitudes on the road map.

FIG. 18 is a flow chart showing the bird's-eye view display routine of the second embodiment. The processing of steps S701, S702 of FIG. 18 are identical with those of steps S201, S202 of FIG. 9. In the next step S703, the information relating to the latitudes and longitudes (hereinafter referred to as latitude longitude data) stored in the map storage memory 2 is retrieved. In the next step S704, road map data in the range of display of the display device 8 are selected and stored in the bird's-eye view data memory 6. In the next step S705, the latitude longitude data retrieved in step S703 are converted into bird's-eye view data so that the parallels and meridians are displayed with the bird's-eye view on the screen.

In the next step S706, the road map data selected in step S704 are converted into bird's-eye view data. In the next step S707, the bird's-eye view data obtained in steps S705 and S706 are converted into map image data, which are then stored in the image memory 7. Thereafter, the control flow returns to the map display routine.

FIG. 19 is a flow chart showing a planimetric map display routine of the second embodiment. The processing of steps S801, S803 of FIG. 19 are identical with those of steps S501, S503 of FIG. 14. In step S802, the latitude longitude data stored in the map storage memory 2 are retrieved. In step S804, the road map data selected in step S803 and the latitude longitude data retrieved in step S802 are converted into map image data, which is then stored in the image memory 7. Thereafter, the control flow returns to the map display routine.

Figure 20A:
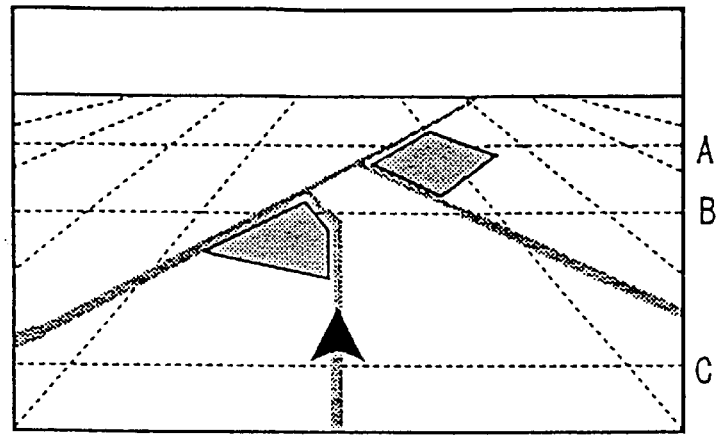
FIGS. 20A through 20C are views showing screen display examples according to the second embodiment.
Figure 20B:
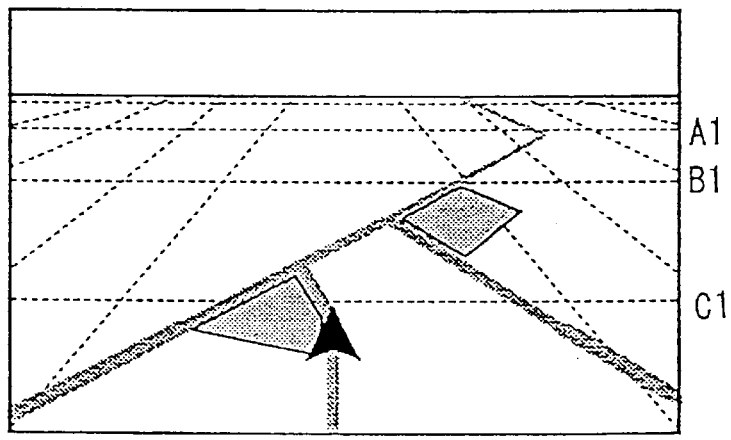
Figure 20C:
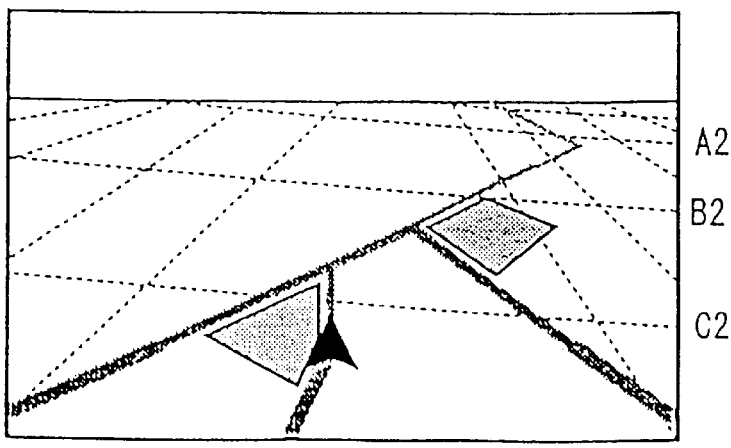

FIGS. 20A–C are views showing an example of screen display of the second embodiment, wherein grid lines indicated by dotted lines in the figures represent the parallels and meridians on the road map. FIG. 20A is a display example taken before movement of a motor vehicle, and FIG. 20B is a display example taken after the vehicle runs a predetermined distance in a travelling direction, while FIG. 20C is a display example taken upon a significant change of the travelling direction of the vehicle.

In the present embodiment, the vehicle position mark is displayed at a fixed position on the screen as a general rule. Therefore, the range of the road map on the screen is changed when the vehicle moves beyond a predetermined distance as shown in FIG. 20B, and the display positions of the grid lines indicating the parallels and meridians are also changed in accordance with the above change. When the road map range on the screen is rotated with a change of the travelling direction of the vehicle as shown in FIG. 20C, the display positions of the grid lines are also rotated according to the rotation of the road map.

The lateral grid lines A, B, C on the screen in FIG. 20A are shifted to A1, B1, C1 in FIG. 20B, and to A2, B2, C2 in FIG. 20C.

According to the second embodiment as described above, the parallels and meridians on the road map are displayed as the grid lines, thereby allowing the driver to grasp the current position of the vehicle with higher accuracy. Further, the display positions of the grid lines are changed according to a change of the road map range on the screen. This makes it easier to grasp a degree of changes of the travelling distance and travelling direction of the vehicle.

In step S203 of FIG. 9 and step S704 of FIG. 18, data present in the trapezoidal range ABCD of FIG. 4 are selected as bird's-eye view data. To increase the processing speed, however, data present in a square region (hatched area in the figure) including the trapezoidal region ABCD as shown in FIG. 21A may be selected as bird's-eye view data, and coordinates in the whole range of the selected square region may be converted.

Figure 21A:
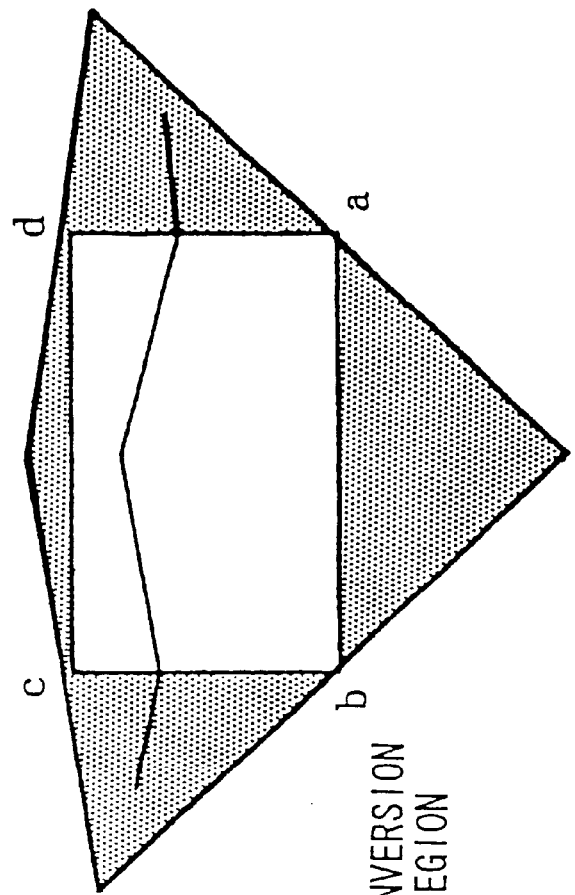
FIGS. 21A, 21B are views showing an example in which a bird's-eye view data are extracted from data in a square region including a trapezoidal region "ABCD".
Figure 21B:
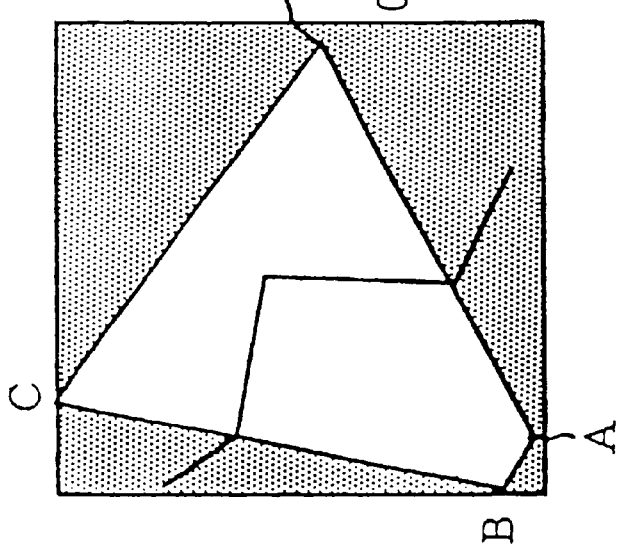

FIG. 21B shows an example of coordinate conversion of the square region of FIG. 21A. A rectangular region "abcd" in the middle portion of FIG. 21B indicates a range that is actually displayed on the display device 6. When the road map data in a wider range than the display range of the display device 6 are converted into bird's-eye view data in this manner, the processing of steps S201–S204 of FIG. 9 or steps S701–S705 of FIG. 18 need not be carried out when the vehicle moves after display of the current bird's-eye view, as long as the data to be used are within the square range of FIG. 21A. Namely, the bird's-eye view can be updated or rewritten by merely shifting the rectangular region of FIG. 21B for display, assuring increased updating speed.

In the illustrated embodiment, parameters, such as the height of the view point, looking-down and looking-around angles used for bird's-eye view indication, are established so that the direction of the destination is indicated. These parameters, however, may be changed as desired by the user. In this case, the range of the trapezoidal region "ABCD" of FIG. 4 may be determined, on the basis of data, such as the height of the view point, that are set by the driver by means of the input device 4, for example. The wider range of road map can be displayed with an increase in the height of the view point, and the bird's-eye view looks closer to an ordinary planimetric map as the looking-down angle increases. Thus, these parameters may be changed as desired so as to display a desired range of the road map in the form of a bird's-eye view. Further, the reduction scale of the bird's-eye view may be also changed as desired, thus increasing the flexibility with which the bird's-eye view is displayed.

It is also possible to provide a mode in which a road map in a narrow range around the current position is displayed in a bird's-eye view, and a mode in which a wide range of road map is displayed in a bird's-eye view, so that one of these modes can be selected as desired by a selecting switch, for example.

While the bird's-eye view is normally displayed on the display device 6 in the illustrated embodiments, a selecting switch, for example, may be operated to arbitrarily select whether the bird's-eye view is displayed or an ordinary planimetric map is displayed. For example, the planimetric view is advantageous for measurement of a distance between two points on a map. By allowing arbitrary selection of the map display mode, the road map can be displayed with increased flexibility.

In the illustrated embodiments, the view point is placed above around the current position of the vehicle, and the road map is looked down from this view point in the direction of the destination. In some cases, however, it is more convenient to display the bird's-eye view obtained by looking down the road map in the travelling direction of the vehicle, depending upon road conditions and others. It may be therefore better to enable the operator to select whether a view taken in the direction of the destination is to be displayed or a view taken in the travelling direction is to be displayed, by means of a selecting switch, for example. Alternatively, the direction in which the road map is looked down may be automatically switched so as to display a bird's-eye view obtained by looking down the road map in the direction of the destination while the vehicle is running on a recommended route, and display a bird's-eye view obtained by looking down the map in the vehicle travelling direction when the vehicle deviates from the recommended route.

Although the line width of roads is changed for each region in the display screen of the display device 6 in the illustrated embodiments, the size of characters or symbols in the name data may be changed for each region. Namely, the size of the characters or the like displayed near the upper edge of the display device 6 may be made smaller than that near the lower edge.

In the illustrated embodiments, the flag mark is displayed in the direction of the destination even if the destination is outside the display range of the display device. In this case, the flag mark may be displayed with a different color or shape from that of the normal flag mark indicating the real destination, so as to discriminate between the provisional and real destinations.

While the road line width is changed for each region on the display screen so as to give a touch of three-dimensional view in the illustrated embodiments, the color may be changed for each region. For example, the region near the lower edge of the display screen is displayed with brighter colors than that near the upper edge, so as to increase the touch of three-dimensional view.

Although the vehicle is guided according to the recommended route obtained by calculation in the illustrated embodiments, the present invention is not limited to such map display apparatus that is provided with the vehicle guiding function. Namely, the present invention is applicable to an apparatus for displaying a bird's-eye view of a road map on the basis of established current position and destination.

While the parallels and meridians on the road map are displayed as the grid lines in the second embodiment, the unit of degrees of latitude and longitude by which the grid lines are displayed may be selected as desired.

In the first embodiment, the grid lines may be graduated at respective sides for display, to inform the operator of how many meters is the distance between adjacent grid lines. In the second embodiment, each grid line may be displayed with the corresponding degree of latitude or longitude.

In the illustrated embodiments, a plurality of kinds of lines may be provided for respective grid lines, and the grid lines may be displayed using the different kinds of lines. For example, thin grid lines may be displayed at an interval of several hundreds of meters, and thick grid lines may be displayed at an interval of several kilometers. If the grid lines near the lower edge of the screen are displayed with thick lines, and the grid lines near the upper edge are displayed with thin lines, the road map can be displayed with increased reality.

Apart from the illustrated embodiments, the current position of the vehicle may be considered as a reference point, and grid lines may be displayed in accordance with the distance from the current position. This makes it further easier to grasp an approximate distance from the current position.

Availability in the Industry

As described above, the map display apparatus for the motor vehicle according to the present invention is adapted to display a bird's-eye view along with grid lines in the display screen of the display device, so that the bird's-eye view is displayed as if it were actually present in the world. Since an image representing the sky, rather than the road map, is displayed on the side of the upper edge of the display screen, the bird's-eye view can be displayed with higher degrees of reality and stability. Further, a mark indicating the destination is displayed whereby the driver can drive with a constant knowledge of the direction of the destination, and is thus less likely to get lost.

We claim:

1. A map display apparatus for a motor vehicle, comprising:
   road map storage device which stores road map data relating to a road map; and
   a display device capable of displaying the road map;
   vehicle position detecting device which detects a vehicle position; said map display apparatus for a motor vehicle, further comprising:
   a destination setting circuit which sets a destination of the vehicle;
   bird's-eye view data converting circuit which converts said road map data into bird's-eye view data, so that a bird's-eye view taken by obliquely looking down the road map from above is displayed on said display device;
   determining circuit which determines whether data relating to said destination is included in said converted bird's-eye view data or not; and
   display control circuit which displays a mark at a display position corresponding to the destination if an affirmative decision is obtained by said determining circuit, and displays said mark at a certain position in a display screen of said display device, which position lies in a direction of the destination, if a negative decision is obtained by said determining circuit.

2. A map display apparatus for a motor vehicle as defined in claim 1, wherein an image representative of the sky is displayed in a sky display region as an upper portion of said display screen of said display device, and the road map is displayed in a map display region other than said sky display region, and wherein
   said bird's-eye view data converting circuit converts the road map data to be displayed in said map display region into the bird's-eye view data.

3. A map display apparatus for a motor vehicle as defined in claim 1, wherein said display control circuit changes a size of said mark depending upon the display position of said mark in said display screen.

4. A map display apparatus for a motor vehicle as defined in claim 3, wherein said display control circuit displays said mark such that the size of the mark increases as the display position of the mark becomes closer to a lower edge of said display screen.

5. A map display apparatus for a motor vehicle as defined in claim 1, wherein said bird's-eye view data converting circuit retrieves said road map data in a predetermined range from said road map storage device, and converts the road map data into said bird's-eye view data, such that said mark is displayed in the vicinity of a center line connecting respective middle points of upper and lower edges of said display screen.

6. A map display apparatus for a motor vehicle as defined in claim 1, comprising selecting circuit which selects only particular kinds of data from said road map data in order to reduce an amount of display data, and wherein said bird's-eye view converting circuit converts the selected road map data into the bird's-eye view data.

7. A map display apparatus for a motor vehicle as defined in claim 6, wherein said selecting circuit changes said particular kinds of data to be selected, depending upon a vertical position of the display data on said display screen.

8. A map display apparatus for a motor vehicle, comprising:
  road map storage device which stores road map data relating to a road map; and
  a display device capable of displaying the road map;
  said map display apparatus for a motor vehicle, further comprising:
    a vehicle position detecting circuit which detects a vehicle position;
    bird's-eye view data converting circuit which retrieves a predetermined range of said road map data from said road map storage device and converts the retrieved road map data into bird's-eye view data, so as to display on said display device a bird's-eye view taken by looking down the road map from a view point at a predetermined looking-down angle in a predetermined looking-down direction, said view point being positioned above the vicinity of the vehicle position on the road map; and
    changing circuit which manually changes at least one of a position of said view point, said looking-down direction and said looking-down angle.

9. A map display apparatus for a motor vehicle, comprising:
  road map storage means for storing road map data relating to a road map; and
  a display device capable of displaying the road map;
  vehicle position detecting means for detecting a vehicle position, said map display apparatus for a motor vehicle, further comprising:
    a destination setting means for setting a destination of the vehicle;
    bird's-eye view data converting means for converting said road map data into bird's-eye view data, so that a bird's-eye view taken by obliquely looking down the road map from above is displayed on said display device;
    determining means for determining whether data relating to said destination is included in said converted bird's-eye view data or not; and
    display control means for displaying a mark at a display position corresponding to the destination if an affirmative decision is obtained by said determining means, and displaying said mark at a certain position in a display screen of said display device, which position lies in a direction of the destination, if a negative decision is obtained by said determining means, said mark at the certain position being changed in size according to a display position of said mark.

10. A map display apparatus for a motor vehicle as defined in claim 9, wherein a road width on the display screen is changed according to the display position of the road in an upper portion or lower portion.

11. A computer program product comprising a computer readable medium having stored thereon a map display system program which includes code segments that:
  detect a vehicle position of a vehicle;
  set a destination of the vehicle;
  convert stored road map data into bird's-eye view data taken by obliquely looking down the road map from above for use on a display screen of a display device;
  determine whether data relating to said destination is included in said converted bird's-eye view data or not;
  display a mark at a display position corresponding to said destination when said data relating to said destination is included in said converted bird's-eye view data, and displaying said mark at a certain position on the display screen which lies in a direction of said destination when said data relating to said destination is not included in said converted bird's-eye view data; and
  change a size of said mark at the certain position according to a display position of said mark.

12. A map display control apparatus for a motor vehicle according to claim 1, wherein said certain position corresponds to a position on an edge portion of said bird's-eye view to be displayed on said display device, said position on the edge portion being closest to said destination.

13. A map display control apparatus for a motor vehicle according to claim 1, wherein said certain position corresponds to a position on which a straight line extending from said vehicle position towards said destination intersects with an edge portion of said bird's-eye view to be displayed on said display device.

14. A map display control apparatus for a motor vehicle, comprising:
  road map storage device which stores road map data relating to a road map; and
  vehicle position detecting device which detects a vehicle position;
  a destination setting circuit which sets a destination of the vehicle;
  bird's-eye view data converting circuit which converts said road map data into bird's-eye view data, so that a bird's-eye view taken by obliquely looking down the road map from above is displayable on a display device;
  determining circuit which determines whether data relating to said destination is included in said converted bird's-eye view data or not; and
  display control circuit which outputs a signal for displaying the road map, outputs a signal displaying a mark at a display position corresponding to the destination if an affirmative decision is obtained by said determining circuit, and outputs a signal for displaying said mark at a certain position in a display screen of the display device, which position lies in a direction of the destination, if a negative decision is obtained by said determining circuit.

* * * * *